(12) United States Patent
Amarloo et al.

(10) Patent No.: US 11,313,926 B1
(45) Date of Patent: Apr. 26, 2022

(54) INTERLOCKABLE VAPOR CELLS

(71) Applicant: Quantum Valley Ideas Laboratories, Waterloo (CA)

(72) Inventors: Hadi Amarloo, Waterloo (CA); Jennifer Ann Joe Erskine, Waterloo (CA); Jaime Ramirez-Serrano, Waterloo (CA); Somayeh M. A. Mirzaee, Kitchener (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 17/480,443

(22) Filed: Sep. 21, 2021

Related U.S. Application Data

(60) Provisional application No. 63/174,289, filed on Apr. 13, 2021.

(51) Int. Cl.
*G01R 33/26* (2006.01)
(52) U.S. Cl.
CPC .................................. *G01R 33/26* (2013.01)
(58) Field of Classification Search
CPC ....................................................... G01R 33/26
See application file for complete search history.

(56) References Cited

U.S. PATENT DOCUMENTS

| | | | |
|---|---|---|---|
| 6,943,885 B2 | 9/2005 | Martin | |
| 10,605,840 B1 | 3/2020 | Amarloo et al. | |
| 10,859,981 B1 | 12/2020 | Ramirez-Serrano et al. | |
| 11,054,453 B2 | 7/2021 | Amarloo | |
| 11,112,298 B2 | 9/2021 | Amarloo et al. | |
| 2003/0136911 A1 | 7/2003 | Martin | |
| 2011/0129986 A1 | 6/2011 | Libralesso et al. | |
| 2011/0147367 A1 | 6/2011 | Borwick, III et al. | |
| 2016/0169989 A1 | 6/2016 | Suzuki et al. | |
| 2021/0114926 A1 | 4/2021 | Ramirez-Serrano et al. | |

OTHER PUBLICATIONS

USPTO, Notice of Allowance dated Jan. 28, 2022, in U.S. Appl. No. 17/480,448, 18 pgs.
Krupka, et al., "Dielectric properties of semi-insulating silicon at microwave frequencies", AppPhysLett 107, 082105, Aug. 2015, 5 pgs.

*Primary Examiner* — Jay Patidar
(74) *Attorney, Agent, or Firm* — Henry Patent Law Firm PLLC

(57) ABSTRACT

In a general aspect, a vapor cell includes a body defined by a stack of layers bonded to each other. The stack of layers includes a first end layer disposed at a first end of the body and a second end layer disposed at a second, opposite end of the body. Intermediate layers extend between the first and second end layers and define an internal cavity extending through the body between the first end layer and the second end layer. The stack of layers also includes first and second sets of tabs. The first set of tabs extends outward from the intermediate layers on a first exterior side of the body, and the second set of tabs extends outward from the intermediate layers on a second exterior side of the body. The vapor cell also includes a vapor or a source of the vapor disposed in the internal cavity.

19 Claims, 12 Drawing Sheets

INTERLOCKABLE VAPOR CELLS

CROSS-REFERENCE TO RELATED APPLICATIONS

This application claims priority to U.S. Prov. App. No. 63/174,289, which was filed on Apr. 13, 2021, and entitled, "Interlockable Vapor Cells." The disclosure of the priority application is hereby incorporated by reference in its entirety.

BACKGROUND

The following description relates to vapor cells, which in some configurations, can be interlockable.

Vapor cells are manufactured by sealing a vapor or gas within an enclosed volume. The vapor or gas can be used as a medium to interact with electromagnetic radiation generated by an external source. Lasers may be directed through the vapor cell, and a response to the lasers can be used to determine properties of the electromagnetic radiation and serve as sensor of electromagnetic radiation.

DETAILED DESCRIPTION

Figure 1A:
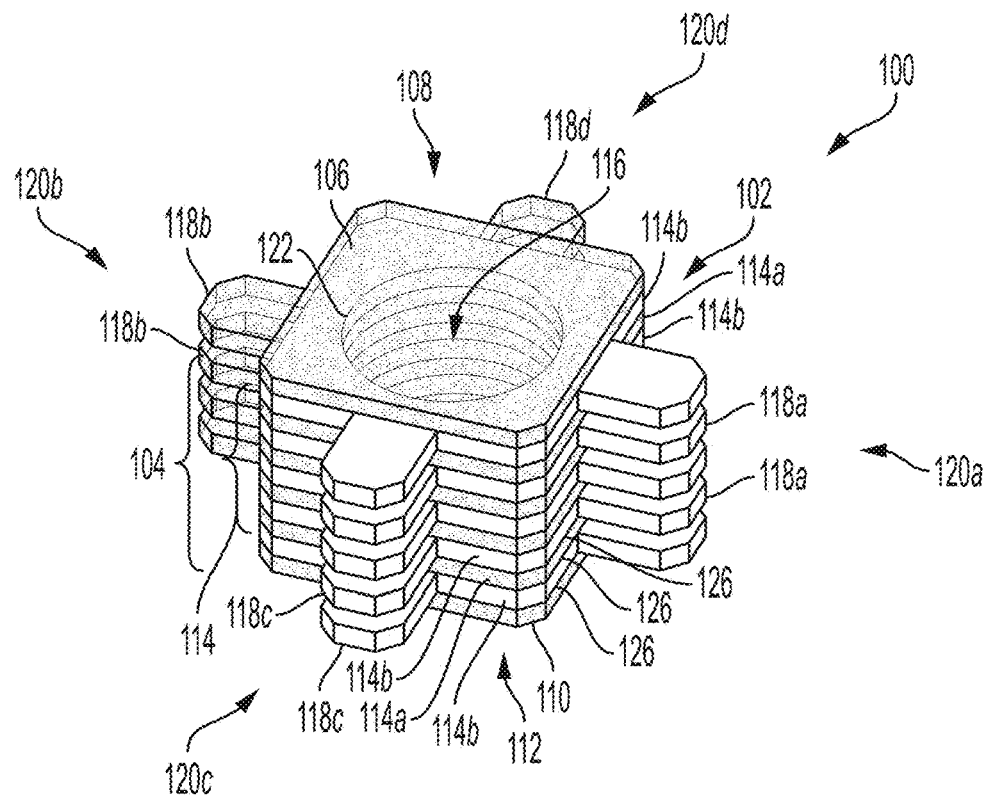
FIG. 1A is a schematic diagram, in perspective view, of an example vapor cell 100.

In a general aspect, a vapor cell may include a body defined by a stack of layers bonded to each other, such as a laminated or bonded stack of layers. This configuration can allow the vapor cell to be manufactured in large numbers and with tight tolerances. The configuration also can allow structuring in three dimensions and tiling multiple instances of the vapor cell for building arrays. During operation, the vapor cells may have a more uniform RF electric field in the center of their interior, thereby making measurements more precise and accurate. In some examples, the average RF electric field amplitude in the interaction region of the vapor cell can be within 1% of the incident RF amplitude with less than 1% variation across the intended interaction region. The background gases in the vapor cell can also be lower than the vapor pressure (e.g., an alkali vapor pressure), so that collisional broadening is reduced or minimized. In some instances, the vapor cell has a lower—and in some configurations significantly lower—radar scattering cross-section than its geometric cross-section. A transparency criterion can be met using a vapor cell geometry that can be scaled for frequencies beyond 40 GHz. The vapor cell interaction region can also be scaled, taking frequency into account, to reduce or minimize transit time broadening. In some cases, the vapor cell can be fiber coupled and configured to work in counter-propagating, co-propagating, or both, geometries of light propagation. In some configurations, multiple instances of the vapor cell may be interlocked with each other through a mechanical interface. Non-interlockable configurations, however, are possible.

FIGS. 1A-6B present schematic diagrams of example configurations for a vapor cell along with example arrangements of some possible tiling patterns or assemblies. The example vapor cells shown in FIGS. 1A-6B include a laminated body of layers, such as that constructed from glass and high resistance (float) silicon. The schematic diagrams illustrate alternating layers of dielectric material (e.g., alternating layers of silicon and glass) but other arrangements of dielectric material are possible. The laminated configuration makes it possible to structure the vapor cell in three dimensions and eases the manufacturing requirements because individual layers can be cut in two dimensions from large, high quality wafers or substrates. In some variations, the layers are anodically bonded together to form the laminated configuration. The top and bottom windows (or end layers) can be made from an optically-transparent dielectric material, such as, for example, a borosilicate glass or an aluminosilicate glass. Each unit can be fiber coupled and the windows can have optical mirrors and filters deposited on them. The configuration of the vapor cells is flexible and allows for three-dimensional structuring and efficient manufacturing. In some variations, the vapor cells have a mechanical interface (e.g., interlocking tabs) that can be used for tiling multiple vapor cells together.

Figure 1B:
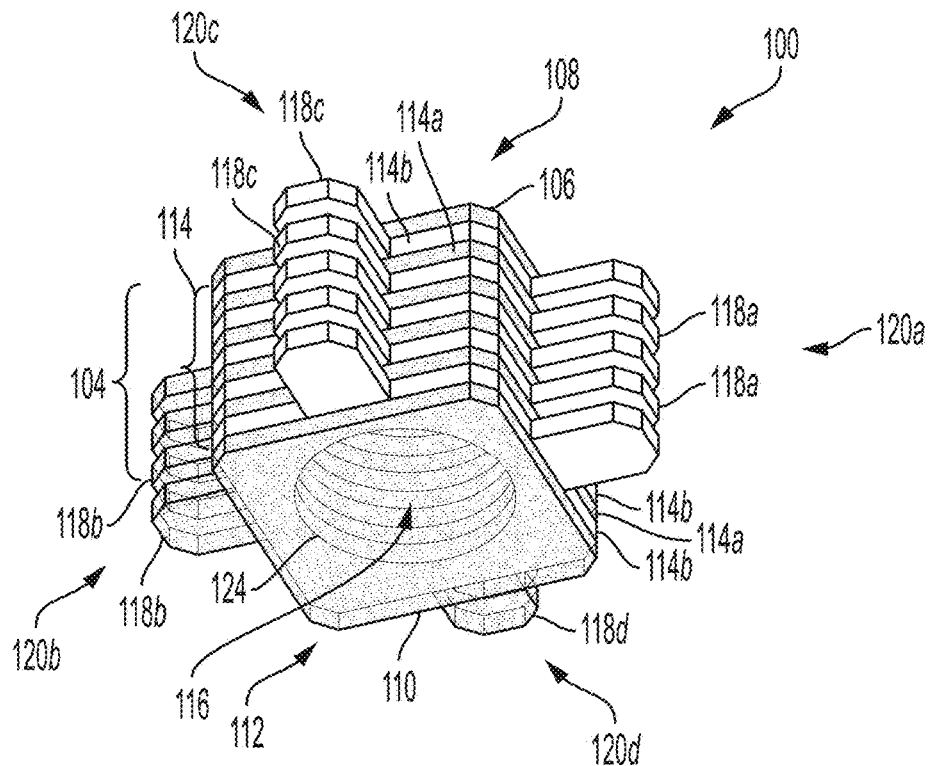
FIG. 1B is a schematic diagram of the example vapor cell of FIG. 1A from a bottom perspective.

Now referring to FIG. 1A, a schematic diagram is presented, in perspective view, of an example vapor cell 100. FIG. 1B presents a schematic diagram of the example vapor cell 100 of FIG. 1A from a bottom perspective. The example vapor cell 100 includes a body 102 defined by a stack of layers 104 bonded to each other (e.g., a laminated body defined by the stack of layers 104). The stack of layers 104 may include one or more external surfaces defining an outer shape of the body 102 (e.g., an outer cuboidal shape, an outer spherical shape, an outer rectangular shape, an outer ellipsoidal shape, etc.). For example, each layer of the stack 104 may include an outer perimeter surface that defines a cross-section of the outer shape at a location of the layer (e.g., a square cross-section, a circular cross-section, a rectangular cross-section, etc.). The cross-section may remain constant along the stack of layers, vary along the stack of layers 104, or some combination thereof. To vary the cross-section, at least two adjacent layers may have respective outer perimeter surfaces that differ, relative to each other, in one or both of shape and size. FIGS. 1A and 1B depict the example vapor cell 100 as having an outer cuboidal shape with a cross-section that is constant along the stack of layers. However, other shapes are possible (e.g., see FIGS. 1C and 1E).

In many implementations, the stack of layers 104 are formed of dielectric material that is transparent to a target electromagnetic radiation measured by the example vapor cell 100. The dielectric material may allow the stack of layers 104 to absorb no more than 1% of the target electromagnetic radiation when such radiation passes through the body 102. The dielectric material may also be an insulating material having a high resistivity, e.g., $\rho > 10^8$ $\Omega\cdot$cm, and may correspond to a single crystal dielectric material, a polycrystalline dielectric material, or an amorphous dielectric material.

In some implementations, a "transparent" dielectric material is one that minimizes the absorption and scattering of the target electromagnetic radiation by the body 102. In these implementations, the stack of layers 104 may transmit the target electromagnetic radiation without significant distortion to the back of the body 102 or its interior. In some variations, the stack of layers 104 has a radar scattering cross-section less than its geometric cross-section. The stack of layers 104 may also have absorption of less than 1% for the target electromagnetic radiation. For example, the stack of layers 104 may be formed, in whole or in part, of float-type silicon. The loss tangent of float-type silicon may be less than $10^{-3}$ for frequencies up to 400 GHz. In certain applications, such as antenna testing, high transparency is required to minimize reflections in a test environment and to make accurate measurements of power over more than one spatial plane or surface. In some cases, the dielectric material forming the stack of layers 104 allows a target electromagnetic field inside the example vapor cell 100 to be within 1% of the target electromagnetic field when incident thereon.

For example, one or more layers of the stack 104 may be formed of silicon, such as a single-crystal silicon. In another example, one or more layers of the stack 104 may be formed of an amorphous material that includes silicon oxide (e.g., $SiO_2$, $SiO_x$, etc.), such as vitreous silica, a borosilicate glass, or an aluminosilicate glass. In yet another example, one or more layers of the stack 104 may be formed of an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, $BaLa_2Ti_4O_{12}$, etc.). The oxide material may also be a single crystal material, a polycrystalline material, or an amorphous material. In still yet another example, one or more layers of the stack 104 may be formed a non-oxide material such as silicon (Si), diamond (C), gallium nitride (GaN), calcium fluoride (CaF), and so forth. Other dielectric materials are possible.

The stack of layers 104 includes a first end layer 106 disposed at a first end 108 of the body 102. The first end layer 106 is formed of a first type of dielectric material that is optically transparent. The first type of dielectric material may be optically transparent to infrared wavelengths of electromagnetic radiation (e.g., 700-1000 nm), visible wavelengths of electromagnetic radiation (e.g., 400-7000 nm), ultraviolet wavelengths of electromagnetic radiation (e.g., 10-400 nm), or some combination thereof. The stack of layers 104 also includes a second end layer 110 disposed at a second, opposite end 112 of the body 102. The second end layer 110 is formed of dielectric material, for example, as described above in relation to the stack of layers 104. The dielectric material may be different than first type of dielectric material forming the first end layer 108. However, in some variations, the second end layer 110 is formed of the first type of dielectric material.

In some variations, the first type of dielectric material includes silicon oxide (e.g., $SiO_2$, $SiO_x$, etc.), such as found within quartz, vitreous silica, or a borosilicate glass. In some variations, the first type of dielectric material includes aluminum oxide (e.g., $Al_2O_3$, $Al_xO_y$, etc.), such as found in sapphire or an aluminosilicate glass. In some variations, the first type of dielectric material is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, $BaLa_2Ti_4O_{12}$, etc.). The oxide material may also be a single crystal oxide material, a polycrystalline oxide material, or an amorphous oxide material. In other variations, the first type of dielectric material is a non-oxide material such as diamond (C), calcium fluoride (CaF), and so forth. Other dielectric materials are possible.

Figure 1C:
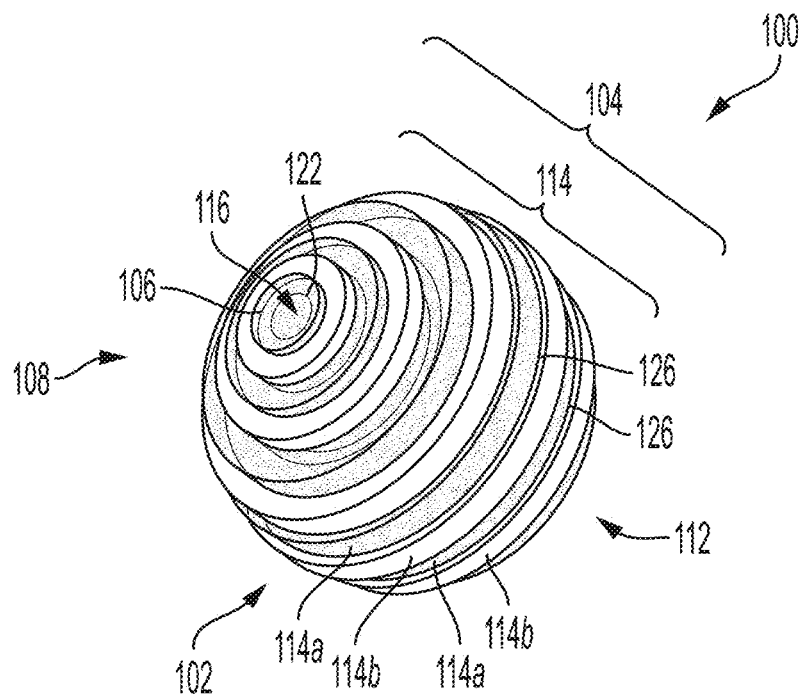
FIG. 1C is a schematic diagram, in perspective view, of the example vapor cell of FIG. 1A, but in which the example vapor cell has a spherical shape and an internal cavity with a spherical shape.
Figure 1D:
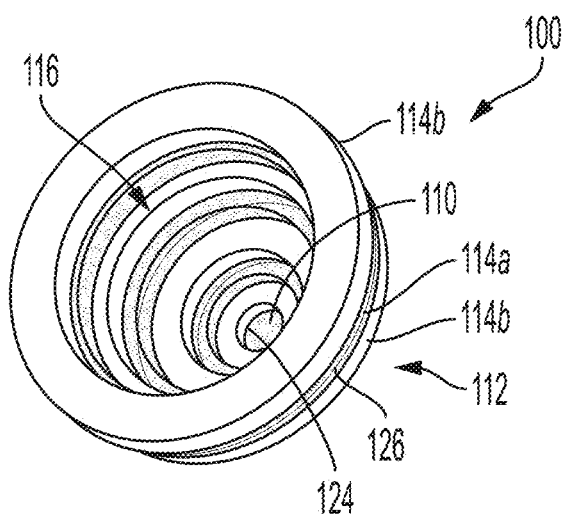
FIG. 1D is a schematic diagram, in perspective view, of a half portion of the example vapor cell of FIG. 1C.

The stack of layers 104 additionally includes intermediate layers 114 between the first and second end layers 106, 110. The intermediate layers 114 may be formed of dielectric material, for example, such as described above in relation to the stack of layers 104. The intermediate layers 114 define an internal cavity 116 that extends through the body 102 between the first end layer 106 and the second end layer 110. The internal cavity 116 may run along an axis that is perpendicular to the stack of layers 104, although other orientations are possible (e.g., a canted axis). Furthermore, although FIGS. 1A and 1B depict the internal cavity 116 as having a cylindrical shape, other shapes are possible (e.g., rectangular, hexagonal, ellipsoidal, spherical, etc.). For example, FIG. 1C presents a schematic diagram, in perspective view, of the example vapor cell 100, but in which the example vapor cell 100 has a spherical shape and an internal cavity 116 with a spherical shape. FIG. 1D presents a schematic diagram, in perspective view, of a half portion of the example vapor cell 100 of FIG. 1C.

In some implementations, each intermediate layer 114 includes a through-hole that defines a portion of the internal cavity 116 through the intermediate layer 114. In these implementations, the through-holes may be selectively configured such that the intermediate layers 114, when stacked, define a target three-dimensional volume for the internal cavity 116 (e.g., a sphere, a frustum, an inclined parallelepiped, etc.). The through-holes may be configured in any combination of shape, size, and location. Other characteristics are possible. In some variations, each through-hole is identical in shape and size. In these variations, the internal cavity 116 may have a cross-section that is constant through the intermediate layers 114. FIGS. 1A and 1B show an example where the through-holes are circular, share a common size, and are aligned along a direction perpendicular to the stack of layers 104. As such, the through-holes define a cylindrical volume for the internal cavity 116. In some variations, at least two adjacent intermediate layers 114 have respective through-holes that differ, relative to each other, in one or both of shape and size. In these variations, the internal cavity 116 may have a cross-section that varies, at least in part, through the intermediate layers 114. FIGS. 1C and 1D show a variation where the through-holes are circular, but differ in size. The through-holes are aligned along a direction perpendicular to the stack of layers 104 to define a spherical volume for the internal cavity 116.

Other features of the intermediate layers 114 may be used to define the target three-dimensional volume. For example, two or more intermediate layers 114 (e.g., adjacent intermediate layers) have different thicknesses. As another example, the through-hole of an intermediate layer may be defined by an internal perimeter of the intermediate layer that includes an internal perimeter surface. The internal perimeter surface may be angled, beveled, or rounded to assist in defining the target three-dimensional volume.

The target three-dimensional volume may be selected to shape a profile of electromagnetic radiation that forms in the internal cavity 116 when the electromagnetic radiation is incident on the example vapor cell 100. For example, the target three-dimensional volume may be selected to concentrate the incident electromagnetic radiation in a center of the internal cavity 116. Such shaping can increase an amplitude of the incident electromagnetic radiation in the internal cavity 116 (e.g., an amplitude of the electric field or magnetic field), making the example vapor cell 100 more sensitive to the incident electromagnetic radiation. The target three-dimensional volume may also be selected to make the profile of the incident electromagnetic radiation more uniform, such as across a desired region within the internal cavity 116. Increasing the uniformity can increase an amount of vapor that interacts with the incident electromagnetic radiation, thereby increasing a sensing region within the internal cavity 116. The target three-dimensional volume may additionally be selected to reduce a thickness of walls surrounding the internal cavity 116, thereby allowing the body 102 of the example vapor cell 100 to be more transparent to the incident electromagnetic radiation. Other benefits are possible.

The target three-dimensional volume may also be selected together with an outer shape of the body 102. Certain volume and outer shape combinations may improve the performance of the example vapor cell 100 for a target application. For example, the internal cavity 116 may have a spherical volume and the body 102 may have an outer spherical shape (e.g., as shown in FIGS. 1C-1D). This combination may allow for easier modeling of electromagnetic field profiles inside and outside of the example vapor cell 100. The ease of such modeling may be used to improve the performance of the example vapor cell 100 in metrological or other applications.

In some implementations, such as those that mitigate or prevent helium permeation, the stack of layers 104 includes layers formed of aluminosilicate glass or borosilicate glass (e.g., Pyrex®). The stack of layers 104 may be coated with materials that exhibit a low helium permeation. Various optical coatings (e.g., Bragg mirrors) can also be deposited on the first and second end layers 106, 110 to act as high reflectors and filters for optical signals used for laser preparation and signals. Waveplates can be used to control the polarization along with polarization-preserving fiber. Moreover, the example vapor cell 100 can be fiber optically coupled using GRIN (gradient index) lenses centered on an end layer of the vapor cell (e.g., the first end layer 106 or the second end layer 110).

The example vapor cell 100 also includes a vapor (not shown) disposed in the internal cavity 116 defined by the intermediate layers 114. The vapor may include constituents such as a gas of alkali-metal atoms, a noble gas, a gas of diatomic halogen molecules, a gas of organic molecules, or some combination thereof. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents.

Additionally or alternatively, the example vapor cell 100 may include a source of the vapor disposed in the internal cavity 116 defined by the intermediate layers 114. The source of the vapor may generate the vapor in response to an energetic stimulus, such as heat, irradiation, and so forth. For example, the vapor may correspond to a gas of alkali-metal atoms and the source of the vapor may correspond to an alkali-metal mass sufficiently cooled to be in a solid or liquid phase when disposed into the cavity 110. In some variations, the source of the vapor resides in the internal cavity 116, and the source of the vapor includes a liquid or solid source of the alkali-metal atoms configured to generate a gas of the alkali-metal atoms when heated. In some variations, the source of the vapor may function, in part, as a getter.

In some implementations, all of the intermediate layers 114 are formed of the same type of dielectric material (e.g., the first type of dielectric material discussed above). In some implementations, the vapor cell can include multiple different types of intermediate layers 114 (e.g., layers of different materials, different thicknesses, different structural features, etc.). In some cases, the intermediate layers 114 may include two or more subsets of layers defining an arrangement of intermediate layers. In these cases, the layers in each subset may share a characteristic in common. For example, the intermediate layers 114 may include a first subset of layers 114a and a second subset of layers 114b, such as shown in FIGS. 1A and 1B. The first subset of layers 114a may be formed of the first type of dielectric material (e.g., one that includes silicon oxide), and the second subset of layers 114b may be formed of a second, different type of dielectric material (e.g., silicon). In another example, the intermediate layers 114 may include a first subset of layers having a thickness different than a second subset of layers. Other common-shared characteristics are possible for the subsets of layers (e.g., a through-hole shape, a through-hole size, the presence of additional cavities, tabs for a mechanical interface, etc.).

In some implementations, such as shown in FIGS. 1A and 1B, the second end layer 110 is formed of the first type of dielectric material and the layers 104 are ordered in the stack to alternate between the first type of dielectric material and the second type of dielectric material. For example, the first and second end layers 106, 110 may be formed of the first type of dielectric material and the first and second subset of layers 114a, 114b may alternate in sequence within the intermediate layers 114. In this configuration, the first subset of layers 114a may be formed of the first type of dielectric material and the second subset of layers 114b may be formed of the second type of dielectric material. Moreover, the first subset of layers 114a may include the outer intermediate layers (e.g., the first and last intermediate layers in the sequence). Such an alternating configuration may allow easier bonding of the stack of layers 104 to each other. The alternating configuration may also reduce an effective dielectric constant of the body 102. Other benefits are possible.

In some implementations, the stack of layers 104 includes sets of tabs 118 extending outward from one or more exterior sides 120 of the body 102. Each set of tabs 118 may define a mechanical interface that allows the example vapor cell 100 to couple with (e.g., interlock with) another vapor cell. In some variations, the sets of tabs 118 include one or more tabs that are an integral part of a layer. For example, an intermediate layer 114 may have inner perimeter surface disposed within an outer perimeter surface. The inner perimeter surface may define the through-hole of the intermediate layer 114 and the outer perimeter surface may define a tab extending outward from an exterior side of the intermediate layer 114. In another example, the first end layer 106 may have an outer perimeter surface that defines a tab extending outward from an exterior side of the first end layer 106.

Figure 1E:
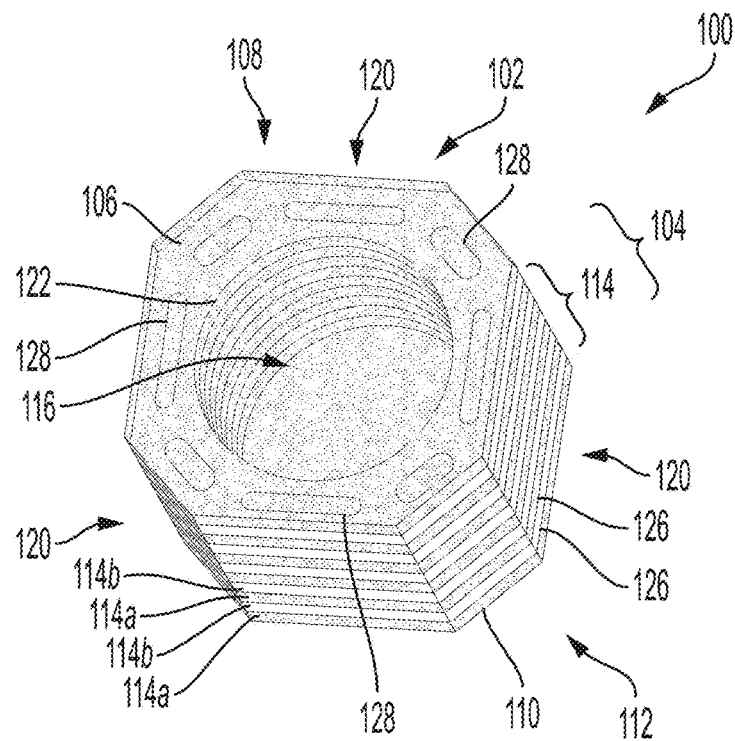
FIG. 1E is a schematic diagram of the example vapor cell of FIG. 1A, but in which the example vapor cell has an octagonal shape and lacks a mechanical interface.
Figure 1F:
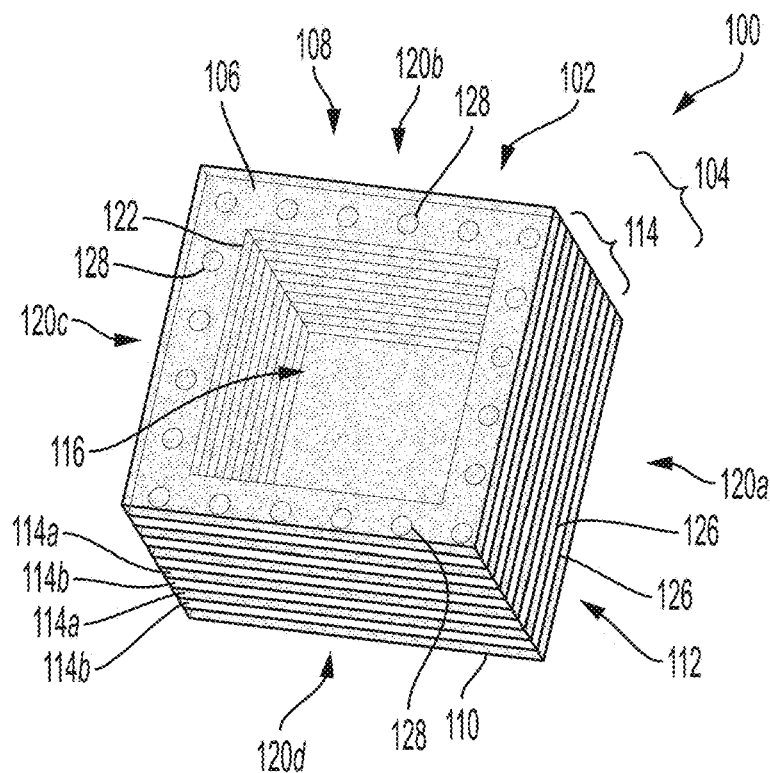
FIG. 1F is a schematic diagram of the example vapor cell of FIG. 1A, but in which the example vapor cell 100 has a square shape and lacks a mechanical interface.

In some implementations, the example vapor cell 100 lacks a mechanical interface (e.g., lacks tabs). FIG. 1E presents a schematic diagram of the example vapor cell 100 of FIG. 1A, but in which the example vapor cell 100 has an octagonal shape and lacks a mechanical interface. Similarly, FIG. 1F presents a schematic diagram of the example vapor cell 100 of FIG. 1A, but in which the example vapor cell 100 has a square shape and lacks a mechanical interface. The example vapor cells 100 of FIGS. 1E and 1F include a plurality of holes 128 between the internal cavity 116 and an exterior surface of the body 102. The plurality of holes 128 may be selected in shape, size, and number to configure the example vapor cells 100 to detect a target radiation (or improve such detection). The plurality of holes 128 may also reduce a radar cross-section of the example vapor cells 100. Features of the plurality of holes 128 are described further in relation to FIGS. 4A-5.

FIGS. 1A and 1B illustrate the stack of layers 104 as having a set of tabs 118 extending outward from each exterior side 120 of the body 102. Moreover, the sets of tabs 118 are illustrated as defining a singular, centrally positioned column on each exterior side 120. However, other configurations are possible. For example, the stack of layers 100 could include a set of tabs 118 extending outward from only a single exterior side 120 of the body 102. As another example, the stack of layers 104 could have a set of tabs 118 defined by a single tab that extends outward from a single exterior side 120. The single tab could be positioned non-centrally on the single exterior side 120. In yet another example, the stack of layers 100 could include a set of tabs 118 aligned with each other along a first dimension on an exterior side 120. Adjacent pairs of tabs along the first dimension may be separated by a gap. In some cases, the gap may correspond to the thickness of a single intermediate layer 114 (e.g., the tabs 118 extend outward from every other intermediate layer 114). However, the gap may correspond to other thicknesses (e.g., two intermediate layers 114). Moreover, the gap need not be the same for each adjacent pair of tabs.

In implementations where the intermediate layers 114 include the first subset of layers 114a and the second subset of layers 114b, the stack of layers 104 may include a first set of tabs 118a and a second set of tabs 118b. The first set of tabs 118a extends outward from the first subset of layers 114a on a first exterior side 120a of the body 102. The second set of tabs 118b extends outward from the second subset of layers 114b on a second exterior side 120b of the body 102. In some implementations, the first subset of tabs 118a extends from a center of the first exterior side 120a of the body 102, and the second subset of tabs 118b extends from a center of the second exterior side 120b of the body 102. Here, the tabs within each subset 118a, 118b are aligned with each other on their respective exterior sides along a first dimension (e.g., from the first end layer 106 to the second end layer 110), and they are each centered on the respective exterior side along a second dimension that is perpendicular to the first dimension. In some implementations, each tab in the first set 118a is an integral part of a respective layer in the first subset of layers 114a, and each tab in the second set 118b is an integral part of a respective layer in the second subset of layers 114b.

In some implementations, such as shown in FIGS. 1A and 1B, the body 102 has four exterior sides 120 defining a square cross-section of the body 102. The four exterior sides 120 include the first and second exterior sides 120a, 120b. The first and second exterior sides 120a, 120b may be adjacent to each other, or alternatively, opposite to each other. In some variations, the four exterior sides 120 include the third and fourth exterior sides 120c, 120d. In these variations, the stack of layers 104 includes a third set of tabs 118c extending outward from the first subset of layers 114a on the third exterior side 120c of the body 102. The body 102 also includes a fourth set of tabs 118d extending outward from the second subset of layers 114b on the fourth exterior side 120d of the body 102. The first, second, third, and fourth sets of tabs 118a, 118b, 118c, 118d may be aligned with respective centers of the first, second, third, and fourth exterior sides 120a, 120b, 120c, 120d.

During operation of the example vapor cell 100, one or more optical signals (e.g., laser light) may interact with the vapor in the internal cavity 116. For example, an optical signal may enter the internal cavity 116 through the first end layer 106 and then exit the internal cavity 116 through the second end layer 106. In another example, an optical signal may enter the internal cavity 116 through the first end layer 106, reflect off an interior surface of the second end layer 106, and then exit the internal cavity 116 through the second end layer 106. If two or more optical signals are used, copropagating or counter-propagating modes of operation may be established. In the co-propagating mode, each optical signal traverses the internal cavity 116 along the same direction. In the counter-propagating mode, each optical signal traverses the internal cavity 116 along opposing directions. Examples of propagation modes for vapor cells, including examples of operating vapor cells, are described in U.S. Pat. No. 10,509,065 entitled "Imaging of Electromagnetic Fields."

To assist in propagating optical signals through the internal cavity 116, the first and second end layers 106, 110 may include one or more optical coatings. Examples of such optical coatings include a reflective coating, an anti-reflective coating, a filter coating, a polarizing coating, and so forth. In some implementations, the first end layer 106 includes an interior surface covering a first opening 122 of the internal cavity 116 adjacent the first end layer 106. The first end layer 106 also includes an exterior surface opposite the interior surface. In these implementations, one or both of the interior and exterior surfaces may have an optical coating disposed thereon. Combinations of optical coatings are possible for each of the interior and exterior surfaces. In some implementations, the second end layer 110 includes an interior surface covering a second opening 124 of the internal cavity 116 adjacent the second end layer 110. The second end layer 110 also includes an exterior surface opposite the interior surface. In these implementations, one or both of the interior and exterior surfaces have an optical coating disposed thereon. Combinations of optical coatings are possible for each of the interior and exterior surfaces.

The stack of layers 104 may include interfaces 126 between adjacent layers of the stack. In some implementations, an interface 126 between at least one pair of adjacent layers in the stack 104 includes a direct bond between the pair. In some implementations, an interface 126 between at least one pair of adjacent layers in the stack 104 includes an adhesion layer. The adhesion layer may assist in bonding the pair of adjacent layers to each other. In some variations, the adhesion layer includes silicon oxide. For example, the stack of layers 104 may alternate between layers formed of silicon and layers formed of borosilicate glass. An adhesion layer of silicon oxide (e.g., $SiO_2$, $SiO_x$, etc.) may be present at one or more interfaces 126 to facilitate the bonding of the stack of layers 104 to each other during manufacture. The adhesion layer may be formed on one or both sides of each layer of silicon to define a bonding surface that can form siloxane bonds with the layers of borosilicate glass, such as through an anodic bonding process or a contact bonding process.

The stack of layers 104 may be bonded to each other using, for example, an anodic bonding process, a contact bonding process, a glass frit bonding process, or some other type of bonding process. Combinations of bonding processes are also possible. In some variations, a contact bonding process is the final bonding process that is used in bonding the layers. For example, the first end layer 106 and the intermediate layers 114 may be bonded to each other using an anodic bonding process. A contact bonding process may then be used to bond the second end layer 110 to the intermediate layers 114, thereby hermetically sealing the vapor or a source of the vapor in the internal cavity 116. As part of the contact bonding process, the second end layer 110 may be positioned to cover an opening of the internal cavity 116 after the internal cavity 116 is filled with the vapor or contains the source of the vapor. In many instances, the internal cavity 116 is evacuated prior to receiving the vapor or the source of the vapor.

The contact-bonding process may include processes to chemically alter a first bonding surface of a first layer (e.g., a last intermediate layer) and a second bonding surface of a second layer (e.g., the second end layer 110). Before alteration, one or both of the first and second bonding surfaces may have a surface roughness, Ra, no greater than a threshold surface roughness. For example, the threshold surface roughness may be 1 nm. In some instances, the first and second bonding surfaces are planar surfaces. The contact bonding process includes altering the first and second bonding surfaces to include, respectively, a first plurality of hydroxyl ligands and a second plurality of hydroxyl ligands. The altered surfaces are then contacted together to form metal-oxygen bonds (e.g., siloxane bonds) that create a bond between the first and second layers (e.g., a seal). The metal-oxygen bonds may form when the first plurality of hydroxyl ligands react with the second plurality of hydroxyl ligands during contact.

In some implementations, altering the first and second bonding surfaces includes activating one or both of the first and second bonding surfaces by exposing their respective surfaces to a plasma. Such exposure may increase a surface energy of the first and second bonding surfaces and chemically prepare the first and second surfaces for subsequent contact bonding. Further chemical preparation may occur by washing, after activation, one or both of the first and second bonding surfaces in water (e.g., deionized water) or a basic aqueous solution. Contact with the water or basic aqueous solution may coordinate metal atoms on the first and second bonding surfaces with hydroxyl ligands.

In some implementations, a contact bond may be formed using metal-oxygen bonds between adjacent layers in the stack of layers 104. For example, the intermediate layers 114 may extend in sequence from a first intermediate layer to a last intermediate layer. The first intermediate layer may be bonded to the first end layer 106, and the second end layer 110 may be positioned adjacent the last intermediate layer. In some variations, a contact bond may be formed between the second end layer 110 and the last intermediate layer using siloxane bonds (i.e., Si—O—Si). A reaction of the contact-bond formation process may be represented by Equation (1):

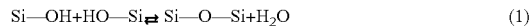

$$\text{Si—OH} + \text{HO—Si} \rightleftarrows \text{Si—O—Si} + \text{H}_2\text{O} \qquad (1)$$

The reaction may be allowed in cases where, for example, the second end layer 110 is formed of silicon oxide and the last intermediate layer is formed of silicon. However, other silicon-containing materials are possible. The reaction is reversible, so in some instances, it is desirable to remove the water molecules generated from the reaction. Otherwise, the newly-formed siloxane bonds are at risk in being hydrolyzed back into silanol bonds (i.e., Si—OH).

Water molecules generated by contact-bonding can be removed by reactions whose products are solid at room temperature. In some implementations, the water molecules are reacted with the vapor in the example vapor cell 100. For example, the vapor may be a gas of cesium atoms, and the water molecules may be reacted with a portion of the gas to form solids, such as $Cs_2O$ ($T_{melt} \cong 340°$ C.), CsOH ($T_{melt} \cong 272°$ C.), or CsH ($T_{melt} \cong 170°$ C.). In some implementations, the water molecules are reacted with a desiccant material that resides in the internal cavity 116 (e.g., as a coating, a dotted mass, etc.). The desiccant material may be inert to the vapor in the vapor cell. For example, the vapor may be a gas of diatomic halogen molecules (e.g., chlorine gas), and the water molecules may be reacted with an anhydrous chloride salt (e.g., $LaCl_3$) to form products, such as hydrated salts or oxyhydroxide compounds (e.g., $LaCl_3 \cdot xH_2O$, LaOCl, etc.).

Although the formation reaction above is presented in the context of silicon as the participating metal atoms, other metal atoms are possible. For example, if a first layer is formed of aluminum oxide (e.g., single-crystal sapphire) and a second, adjacent layer is also formed of aluminum oxide (e.g., $Al_2O_3$ polycrystalline ceramic), the contact-bond formation process may utilize aluminum as the metal atom and form oxo-aluminum bonds (e.g., Al—O—Al). Mixtures of metals are also possible. For example, if the first layer is formed of zirconium oxide and the second, adjacent layer is formed of magnesium oxide, the contact-bond process may utilize zirconium and magnesium as the metal atoms and form zirconium-oxo-magnesium bonds.

In general, for a first layer that includes a first metal, $M_1$, and a second, adjacent layer that includes a second metal, $M_2$, a reaction of the contact-bond formation process may be represented by Equation (2):

$$M_1\text{-OH} + \text{HO-}M_2 \rightleftarrows M_1\text{-O-}M_2 + H_2O \qquad (2)$$

Here, a hydroxyl ligand (i.e., OH) is coordinated to each of the metal atoms, $M_1$ and $M_2$, and the hydroxyl ligands condense into an oxo ligand (O) during formation of the metal-oxygen bond (i.e., $M_1$-O-$M_2$). A water molecule is liberated as a by-product of this condensation process. Although the reaction suggests a single hydroxyl ligand per metal atom, other numbers of hydroxyl ligands may be coordinated to each of the metal atoms, $M_1$ and $M_2$.

In many variations, the condensation of hydroxyl ligands occurs at room temperature upon contact of the first and second adjacent layers (or mating surfaces thereof). However, in some variations, heat may be applied to initiate and/or complete the formation of the contact bond. The heat may also strengthen the contact bond. For example, heat may be applied to one or both of the first and second adjacent layers to increase their respective temperatures to a processing temperature. The processing temperature may facilitate formation of the contact bond. In some variations, the processing temperature is no greater than 250° C. In some variations, the processing temperature is no greater than 120° C. In some variations, the processing temperature is no greater than 75° C. Contact bonding processes are further described in U.S. Pat. No. 10,859,981 entitled "Vapor Cells Having One or More Optical Windows Bonded to a Dielectric Body."

In some implementations, contact bonding processes may provide certain advantages over anodic bonding processes, for example, in applications that are sensitive to the purity of the vapor in the internal cavity 116. The process of forming an anodic bond can, in some instances, introduce undesirable gases into the internal cavity 116, such as by generating one or more volatile chemical species. These gases may produce a background vapor pressure that can have a deleterious effect on the vapor (e.g., broadens the Rydberg transition of atoms or molecules in the vapor). The process of forming a contact bonding does not rely on the large electric fields and high temperatures common to anodic bonding and thereby mitigates (or eliminates entirely) the introduction of undesirable gases into the internal cavity 116. If a background vapor pressure does result from the contact bonding process, this pressure is notably less than the pressure of the desired vapor in the internal cavity 116 and can still allow for a high purity vapor.

In some implementations, the example vapor cell 100 is a first vapor cell that can be mechanically connected (e.g., interlocked) with other vapor cells. The mechanical connections between the vapor cells can be formed by mating complementary mechanical interfaces of respective vapor cells. For example, the first set of tabs 118a may define a first mechanical interface that is configured to interlock with a mechanical interface of a second vapor cell. Similarly, the second set of tabs 118b may define a second mechanical interface that is configured to interlock with a mechanical interface of a third vapor cell. In some implementations, the example vapor cell 100 is part of a plurality of such cells. In these implementations, the first and second subsets of tabs 118a, 118b of each vapor cell are interlocked with, respectively, the second subset of tabs 118b of a first vapor cell and the first subset of tabs 118a of a second, different vapor cell.

Figure 1G:
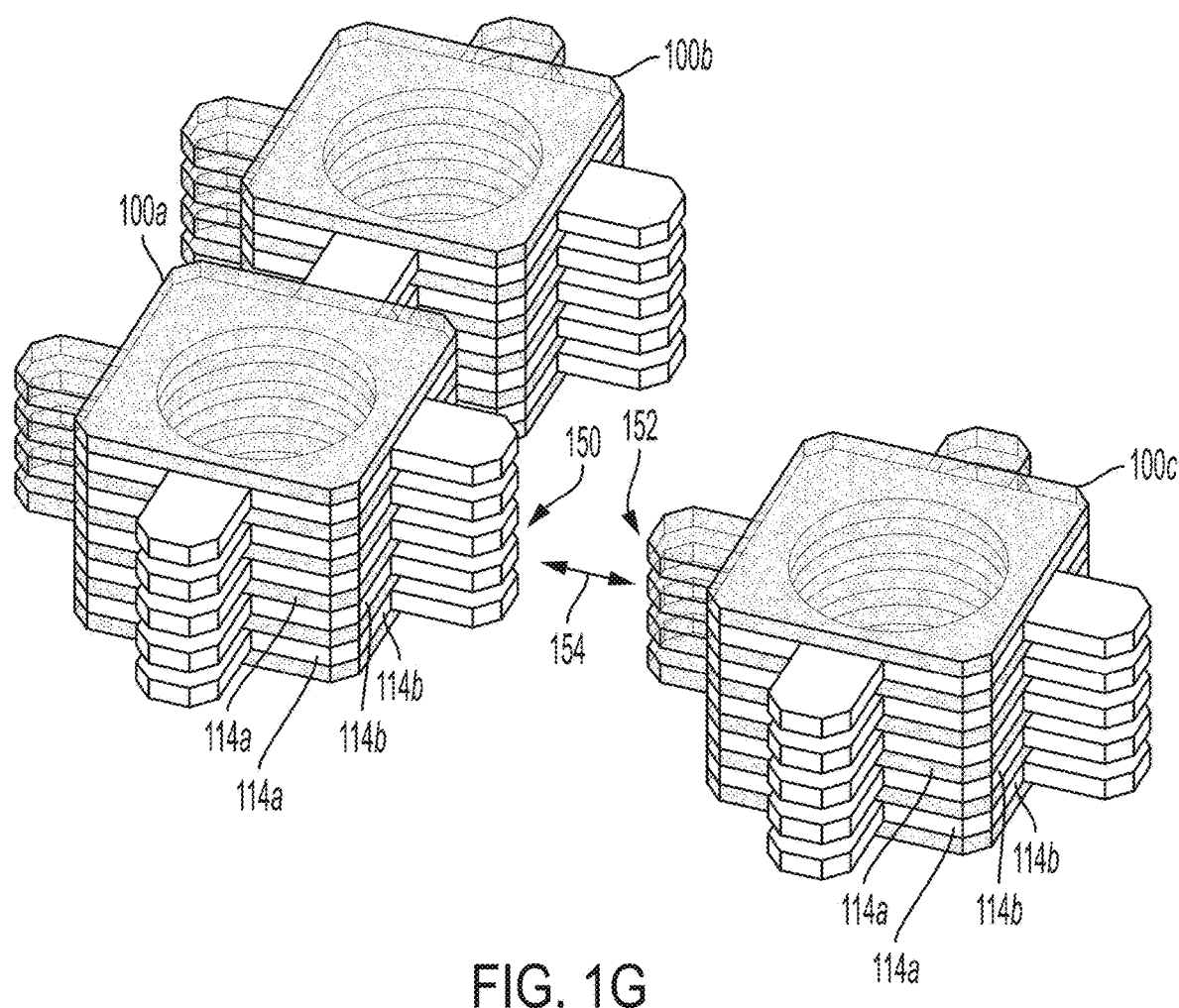
FIG. 1G is a schematic diagram, in perspective view, of three instances of the example vapor cell of FIG. 1A in which two instances are coupled to each other.

FIG. 1G presents a schematic diagram, in perspective view, of three instances 100a, 100b, 100c of the example vapor cell 100 of FIG. 1A in which two instances 100a, 100b are coupled to each other. The first instance 100a includes a set of tabs 150 extending outward from the second subset of layers 114b but not the first subset of layers 114a. The first and second subset of layers 114a, 114b alternate in sequence and thus create gaps in the set of tabs 150 (e.g., gaps between adjacent tabs) capable of receiving tabs from another instance, such as the third instance 100c. The gaps may be dimensioned to allow a sliding fit, such as a slip fit, with these tabs. The third instance 100c includes a set of tabs 152 that, converse to the first instance 100a, extends outward from the first subset of layers 114a but not the second subset of layers 114b. This inverse arrangement allows the set of tabs 152 to interlock with the set of tabs 150 during engagement. As such, the sets of tabs 150, 152 define respective interlockable mechanical interfaces for the first and third instances 100a, 100c. An arrow 154 indicates a motion of the third instance 100c to engage or disengage the set of tabs 152 with the set of tabs 150 from the first instance 100a, thereby coupling or uncoupling the two instances 100a, 100c. In some variations, the sets of tabs 150, 152 may be bonded to each other after being interlocked by using, for example, an anodic bonding process, a contact bonding process, a glass frit bonding process, or some other type of bonding process (e.g., mechanical bonding, such as with a screw or pin formed of dielectric material).

Figure 2A:
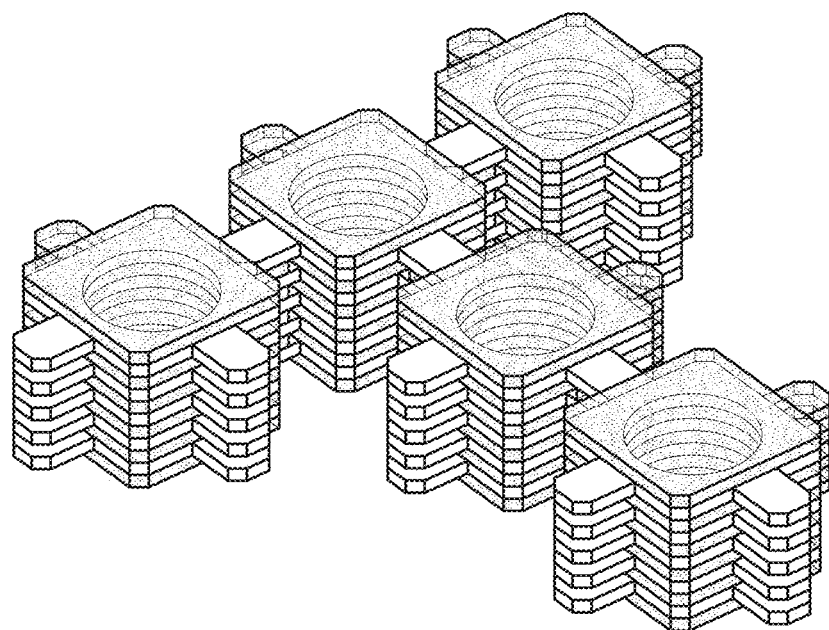
FIG. 2A is a schematic diagram, in perspective view, of five instances of the example vapor cell of FIG. 1A that are interlocked with each other to form a "tee" subassembly.
Figure 2B:
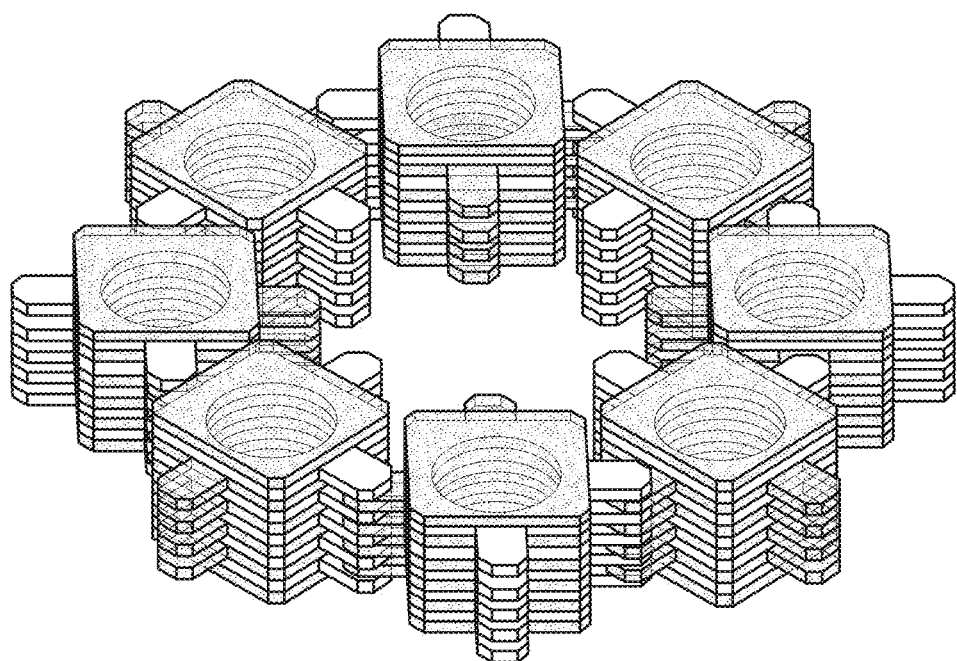
FIG. 2B is a schematic diagram, in perspective view, of eight instances of the example vapor cell of FIG. 1A that are interlocked with each other to form an octagon subassembly.
Figure 3A:
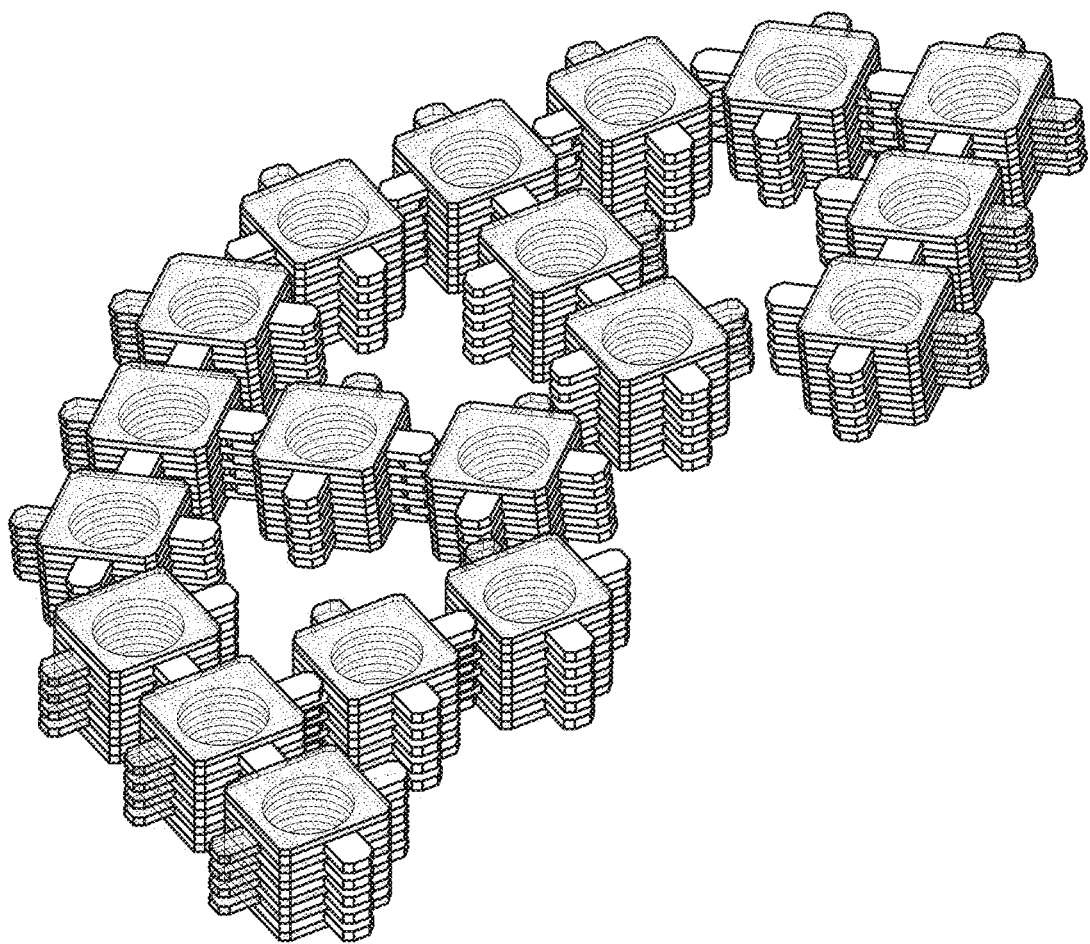
FIG. 3A is a schematic diagram, in perspective view, of five instances of the "tee" subassembly of FIG. 2A that are interlocked with each other to form an arcuate assembly.
Figure 3B:
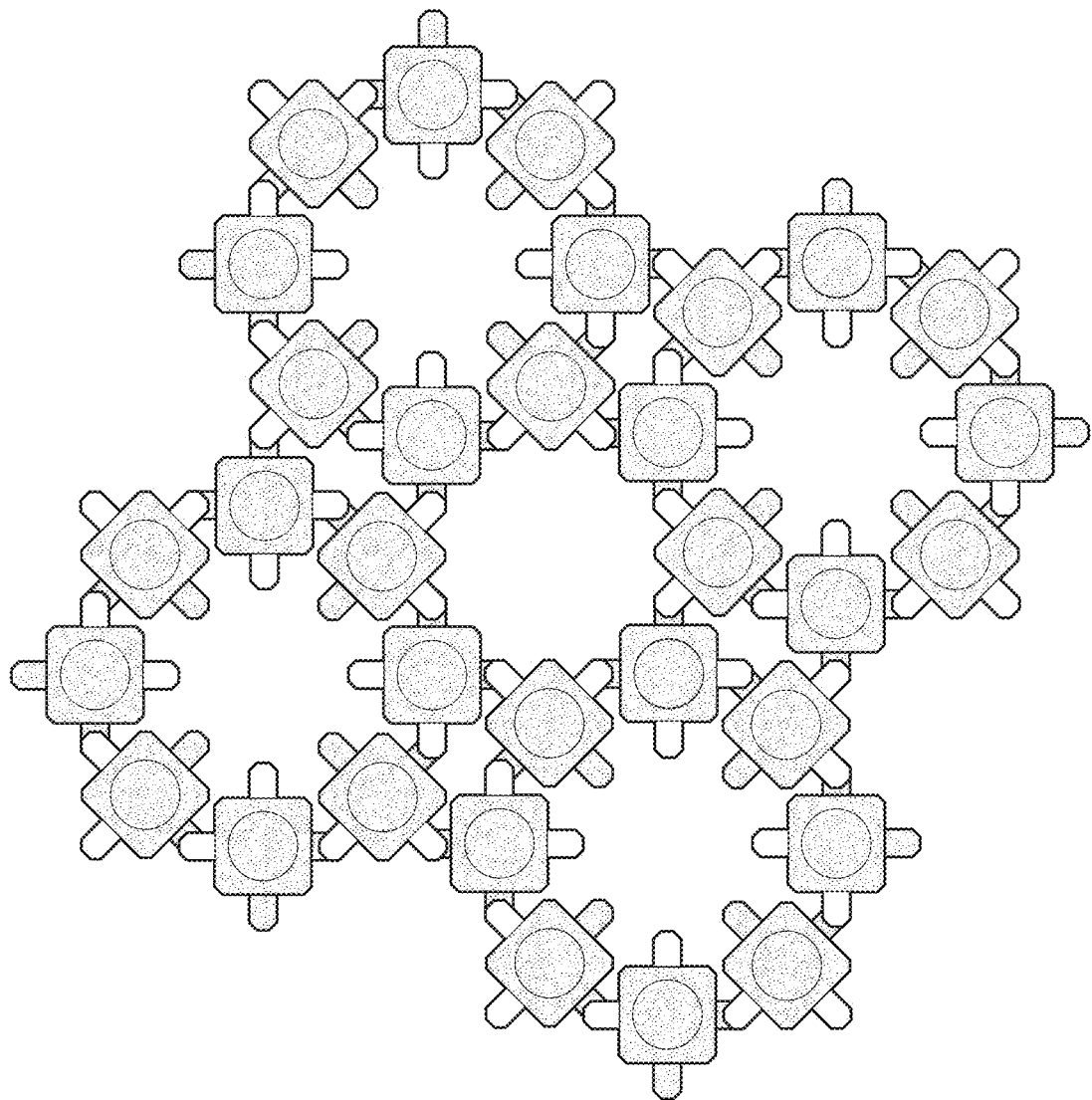
FIG. 3B is a schematic diagram, in top view, of four instances of the octagon subassembly of FIG. 2B that are interlocked with each other to form a tiled pattern.

Instances of the example vapor cell 100 may be interlocked with each other to form a multi-dimensional array or tiled pattern. In some variations, instances of the example vapor cell 100 are interlocked with each other to form a patterned subassembly. For example, FIG. 2A presents a schematic diagram, in perspective view, of five instances of the example vapor cell 100 of FIG. 1A that are interlocked with each other to form a "tee" subassembly. As another example, FIG. 2B presents a schematic diagram, in perspective view, of eight instances of the example vapor cell 100 of FIG. 1A that are interlocked with each other to form an octagon subassembly. Other arrangements are possible for the patterned subassembly. In further variations, the patterned subassemblies define a repeatable motif for a larger assembly or tiled pattern (e.g., a mosaic). For example, FIG. 3A presents a schematic diagram, in perspective view, of five instances of the "tee" subassembly of FIG. 2A that are interlocked with each other to form an arcuate assembly. As another example, FIG. 3B presents a schematic diagram, in top view, of four instances of the octagon subassembly of FIG. 2B that are interlocked with each other to form tiled pattern. Other large assemblies or tiled patterns are possible. For example, an assembly of interlocked vapor cells may be connected to form a variety of spatial arrangements (e.g., ordered or disordered arrays) in two or three spatial dimensions.

A tiled pattern or array of interlocked vapor cells may have several advantages, especially for imaging applications. During operation, the interlocked vapor cells may measure a target electromagnetic field that traverses a volume occupied by the interlocked vapor cells. As part of this measurement, a laser may generate optical signals that interact with the vapor in the internal cavities of one or more interlocked vapor cells. Such interaction allows the target electromagnetic field to be readout by the one or more interlocked vapor cells. However, when arranged in a tiled pattern or array, the power used by the laser to readout a target electromagnetic field can be efficiently distributed to each individual vapor cell (e.g., such as through a fiber optic cable or group of such cables). This distribution allows only the necessary sampling of the target electromagnetic field during readout. Moreover, after interacting with the vapor(s), the optical signals can be detected using individual optical detectors (e.g., photodiodes). These optical detectors may then produce respective detector signals (e.g., electrical signals) that can be processed using SoCs or FPGAs. In some cases, modulation techniques can be implemented to achieve high signal-to-noise ratios for each interlocked vapor cell (or channel).

The interlocked vapor cells, when arranged in a tiled pattern or array, may also present a lower amount of material to the target electromagnetic field, thereby maximizing a group transparency of the interlocked vapor cells. Furthermore, unlike implementations that rely on a large single vapor cell, a tiled pattern or array can be repaired at a granular level, for example, by replacing one or more individual interlocked vapor cells. This capability avoids having to replace the entire tiled pattern or array should its operational performance become impaired due to a malfunctioning portion. Additionally, the detector signals generated during operation of the tiled pattern or array can be equalized to zero-out interference from certain directions. By equalizing these signals, a better detection of desired signals can be obtained. Moreover, equalizing the signals may allow the tiled pattern or array to select a direction along which the target electromagnetic field is measured. Such selection or 'steering' is analogous to the steering of a multi-element, beam-forming metal antenna. It will be appreciated that, due to its granular configuration, the tiled pattern or array can also compensate for a malfunctioning or dead cell in the tiled pattern or array. For example, the arrayed or tiled arrangement can oversample signals coming from different directions and thus remain robust to aging. Other advantages are also possible.

In some implementations, at least one of the intermediate layers 114 includes a plurality of holes 128 between the internal cavity 116 and an outer perimeter of the intermediate layer 114 (e.g., as shown in FIGS. 1E and 1F). The plurality of holes 128 may extend partially through or completely through the intermediate layer 114. In these implementations, the example vapor cell 100 may be configured to detect a target radiation and each of the plurality of holes 128 may have a largest dimension no greater than a wavelength of the target radiation. For example, the target radiation may have a wavelength of at least 0.3 mm and each of the plurality of holes 128 may have a largest dimension no greater than 0.3 mm. In some implementations, one or more of the plurality of holes 128 may include a source of the vapor therein. In these embodiments, the intermediate layer 114 may define a channel (or part thereof) that fluidly couples the one or more holes 128 to the internal cavity 116.

Figure 4A:
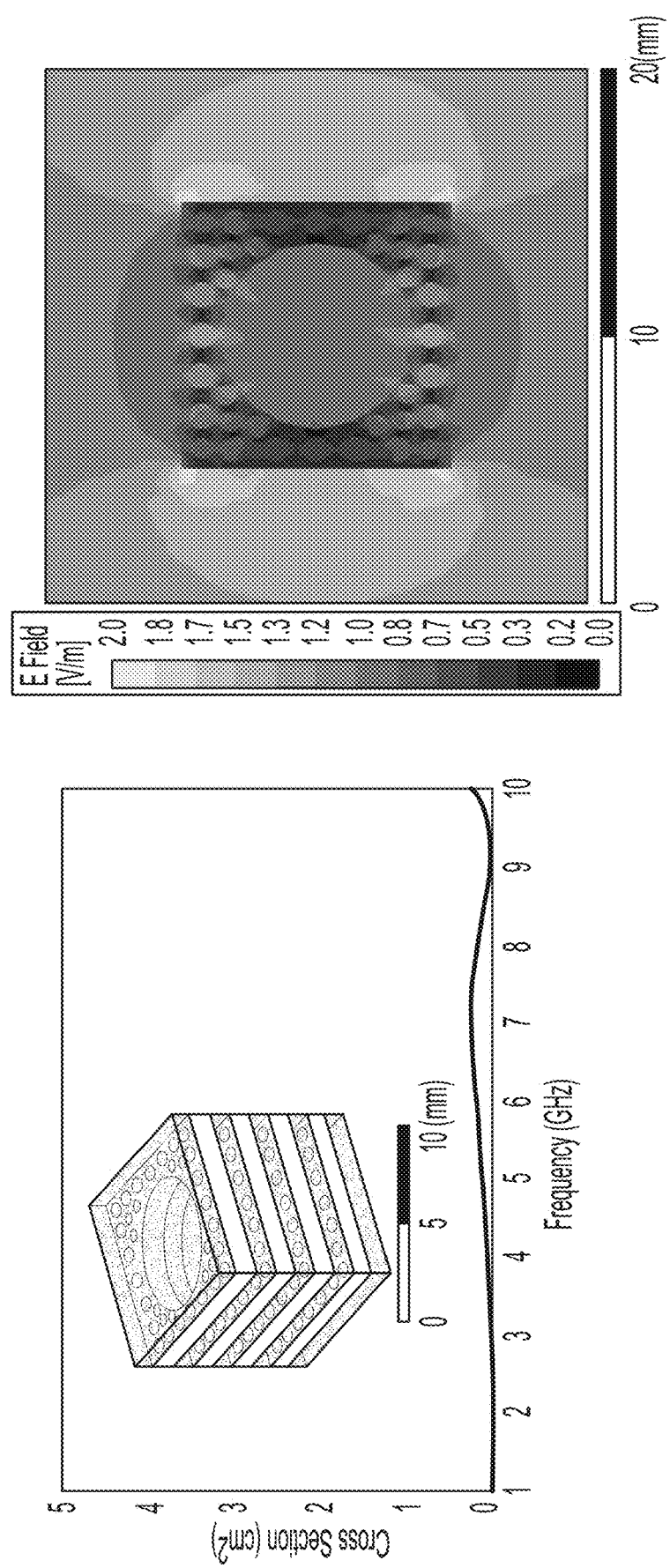
FIG. 4A is an electromagnetic simulation, shown in graph form, of an example configuration of a vapor cell, in which a plurality of holes is present in each intermediate layer.
Figure 4B:
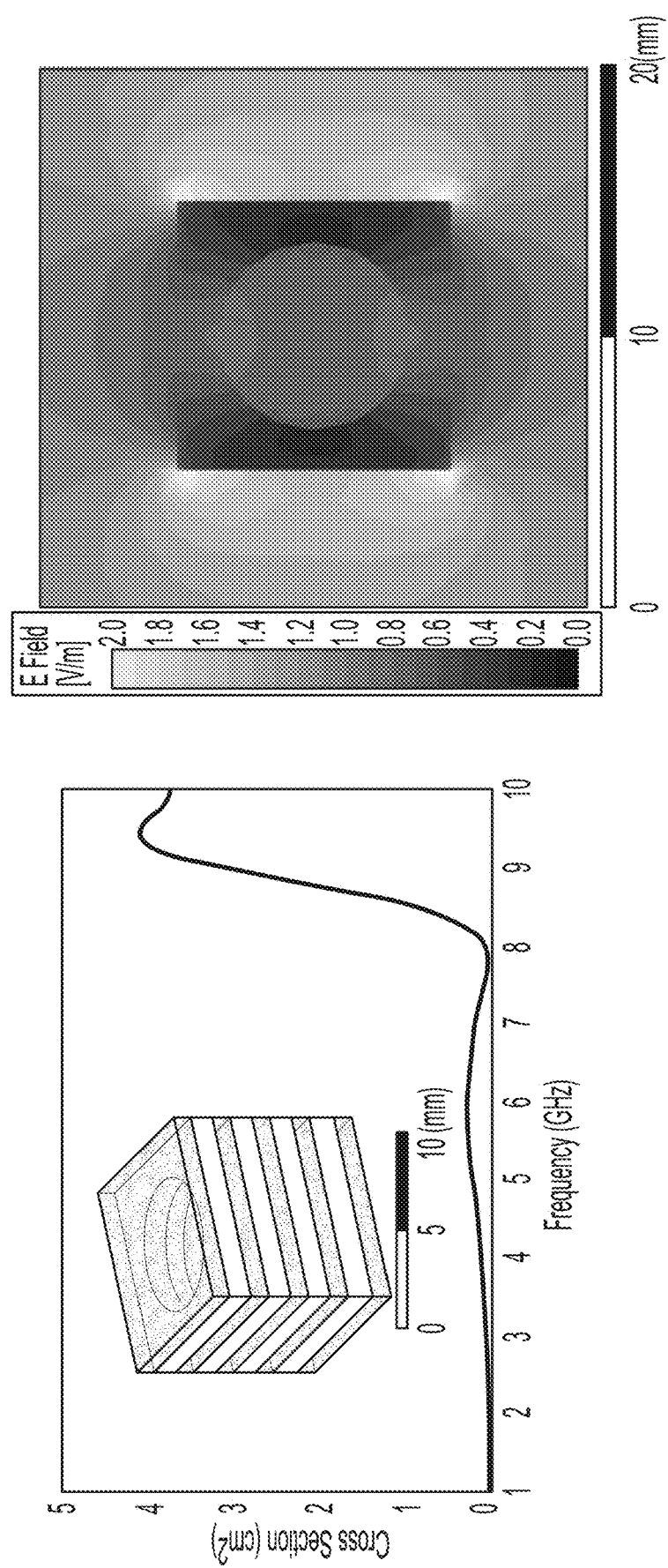
FIG. 4B is an electromagnetic simulation, shown in graph form, of an example configuration of the vapor cell of FIG. 4A, but in which the plurality of holes is not present.

FIGS. 4A and 4B present electromagnetic simulations, including absorptive effects, of two example configurations of vapor cells. The example vapor cells represented in FIGS. 4A and 4B may include features that are analogous to the example vapor cell 100 of FIG. 1A. In the example simulations represented in FIGS. 4A and 4B, the incident electric field is simulated to have an amplitude of 1 V m$^{-1}$. The example configuration of FIG. 4A corresponds to a vapor cell in which a plurality of holes is present in each intermediate layer (e.g., between the internal cavity and an outer perimeter of the intermediate layer). By way of comparison, the example configuration of FIG. 4B corresponds to a vapor cell in which the plurality of holes is absent (e.g., the body has solid walls). In these example configurations, the outer geometry has a square cross-section. However, other shapes are possible (e.g., a circular cross-section). The outer dimensions are square with 1 cm sides. The diameter of the internal cavity, which is cylindrical, is 7 mm. In FIG. 4A, material has been removed from the intermediate layers to create perforations therein (e.g., holes, cavities, etc.). Such perforations may allow the vapor cell to be engineered for an RF electric field inside the internal cavity. The thickness of the layers and the hole patterns used for each layer may be changed as needed, such as to match a target radiation for sensing. The electric field distribution in the perforated configuration is more uniform and unperturbed than the non-perforated configuration. In addition, the first dipole resonance of the structure has its peak at higher frequency in the perforated configuration than the non-perforated configuration.

Each of the vapor cells in FIGS. 4A and 4B may be configured to detect a target radiation having a wavelength, $\lambda$. Even though each vapor cell has a dimension of about $\lambda/15$ at 2 GHz, differences can be observed in the field distributions, e.g., the electric field uniformity inside the vapor cell volume. These differences can be amplified at the larger frequencies. For example, the first dipole resonance of the vapor cell will start to be significant for the configuration with non-perforated walls unless the $\lambda/15$ dimensions are maintained, which makes the vapor cell fragile while at the same time reducing the sensing volume. In some cases, perforated walls can allow high performance in a larger vapor cell, which will increase the signal to noise (e.g., through more atomic vapor) and make it easier to build an array of vapor cells. The larger sized vapor cell can also help in manufacturing large quantities of vapor cells that conform to certain specifications. For higher frequencies (e.g., greater than 40 GHz), the vapor cells can also be fabricated from single wafers of glass and silicon using the same principles. In some examples, the radar cross-section for the square cell is $8\times10^{-7}$ m$^2$ (about 0.008 the geometric cross-section) at 2 GHz while the radar cross-section for the perforated configuration is $4\times10^{-7}$ m$^2$ (about 0.004 the geometric cross-section) at 2 GHz.

Figure 5:
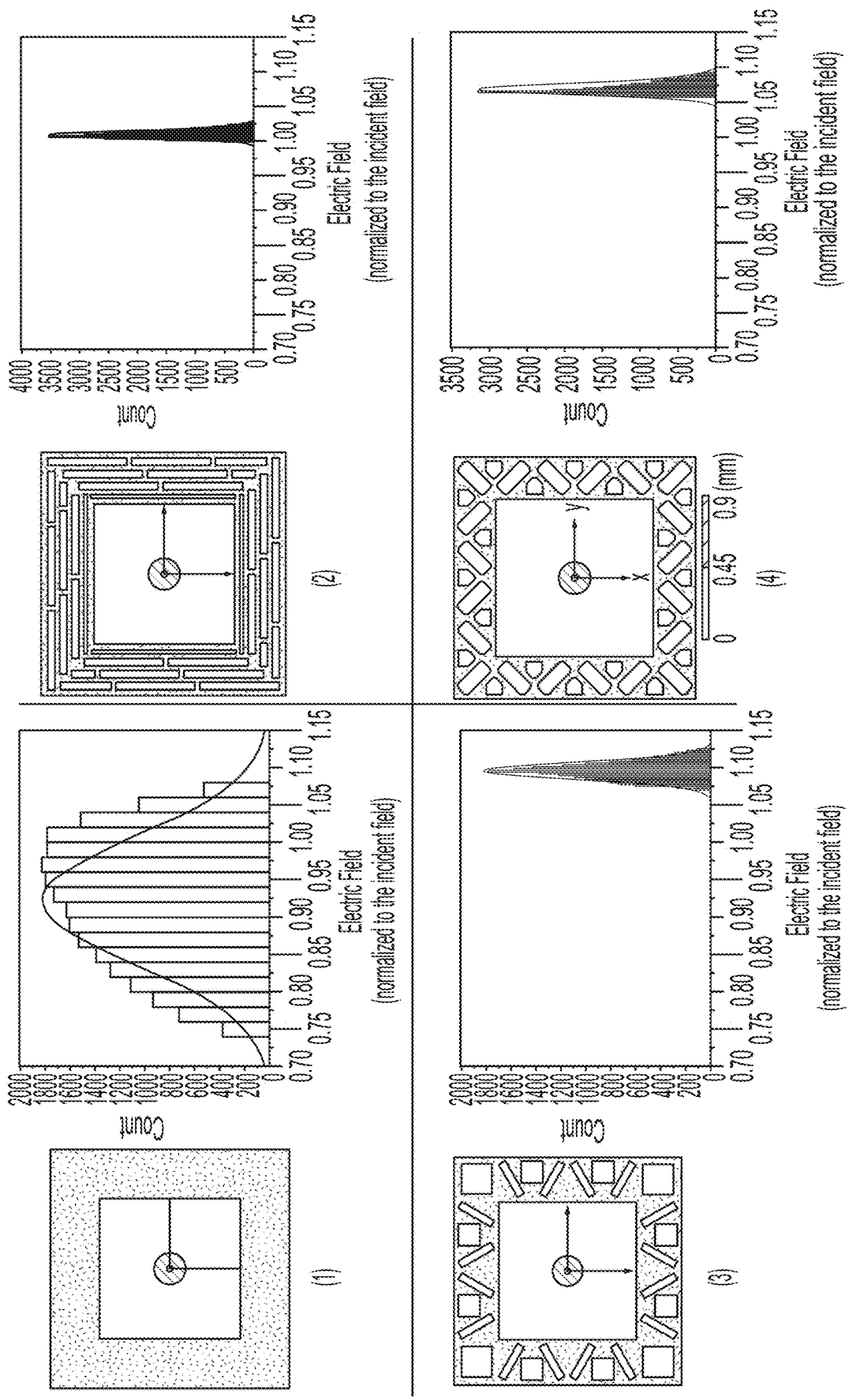
FIG. 5 is an electromagnetic simulation, shown in graph form, of electric field distributions inside of various example configurations of vapor cells having perforated walls.

FIG. 5 presents electromagnetic simulations of electric field distributions inside various example configurations of vapor cells having perforated walls. Different configurations of hole patterns, e.g., in panels (2)-(4), are compared to that of a cubic cell with no perforations in the walls, e.g., panel (1). In the example simulations represented in FIG. 5, the incident electric field has unit amplitude. As shown, the vapor cells with perforated walls have narrower electric field amplitude distributions than the non-perforated control vapor cell. The average field illustrated in panels (2) and (4) has less than 1% variation through the vapor cell in the interaction region shown (hatched region in the center of each cross-section). The vapor cells are configured to detect a target radiation having a wavelength, $\lambda$, and are simulated for frequencies where the dimensions (e.g., side lengths) are about $\lambda/3$-$\lambda/4$.

In some implementations, manufacturing the example vapor cell 100 includes obtaining a stack of layers 104 that are bonded to each other, such as through anodic bonding, contact bonding, glass frit bonding, or some other type of bonding. Combinations of bonding processes are also possible. The stack of layers 104 includes a first end layer 106 and intermediate layers 114 extending in sequence from a first intermediate layer to a last intermediate layer. The first end layer 106 is formed of a first type of dielectric material that is optically transparent, and the first intermediate layer is bonded to the first end layer 106. The intermediate layers 114 include a first subset of layers 114a and a second subset of layers 114b. The first subset of layers 114a is formed of the first type of dielectric material and the second subset of layers 114b is formed of a second, different type of dielectric material. An internal cavity 116 extends through the intermediate layers 114 and includes an opening 122 defined by a surface of the last intermediate layer.

The manufacturing process may also include disposing a vapor or a source of the vapor into the internal cavity 116 and bonding a second end layer 110 of the stack of layers 104 to the last intermediate layer to seal the vapor or the source of the vapor in the internal cavity 116. The second end layer 110 is formed of dielectric material that, in some variations, is the first type of dielectric material. The stack of layers 104, when including the bonded second end layer 110, defines a body 102 of the example vapor cell 100. Moreover, the first end layer 106 resides at a first end of the body 102 and the second end layer 110 resides at a second, opposite end of the body 102.

In some implementations, obtaining the stack of layers 104 includes alternately bonding layers of the first and second subset of layers 114a, 114b to each other to form the intermediate layers 114. Obtaining the stack of layers 104 may also include bonding the first intermediate layer to the first end layer 106, such as through anodic bonding, contact bonding, glass frit bonding, or some other type of bonding. In further implementations, obtaining the stack of layers 104 includes removing material from a first wafer formed of the first type of dielectric material to fabricate the first end layer, one or more of the first subset of layers, or both. Obtaining the stack of layers 104 may also include removing material from a second wafer formed of the second type of dielectric material to fabricate one or more of the second subset of layers. Removing material may include machining material from a wafer with a laser, etching material from a wafer, or both. The process of etching may involve one or both of a dry or wet etching process. Other types of subtractive processes are possible for removing material (e.g., ablation, grinding, polishing, etc.).

In some implementations, bonding the second end layer 110 includes altering the surface of the last intermediate layer to include a first plurality of hydroxyl ligands. Bonding the second end layer 110 also includes altering a surface of the second end layer to include a second plurality of hydroxyl ligands. In these implementations, the altered surfaces may be contacted to each other to form a seal around the opening of the internal cavity. The seal is defined by metal-oxygen bonds formed by reacting the first plurality of hydroxyl ligands with the second plurality of hydroxyl ligands during contact of the two altered surfaces, such as described above in relation to Equations (1) and (2).

FIGS. 1A-5 illustrate the example vapor cell 100 in the context of a single internal cavity 116. However, other numbers and types of cavities are possible. In some implementations, the stack of layers 104 defines a plurality of internal cavities 116, each of which, corresponds to a vapor subcell (or unit cell). In some implementations, the stack of layers 104 may define one or more holes passing therethrough (e.g., a through-hole). The one or more holes may extend between a pair of openings defined by exterior surfaces of the first and second end layers 106, 110. In some implementations, the stack of layers 104 defines both the plurality of internal cavities 116 and the one or more holes. The plurality of internal cavities 116 and the one or more holes may be arranged according to a pattern or array, such as shown in FIGS. 2A-2B and 3A-3B. In implementations having one or both of the plurality of cavities and the one or more holes, the stack of layers 104 may be configured without the first and seconds set of tabs 118a, 118b.

In some implementations, the plurality of cavities 116 and the one or more holes may be arranged according to a two-dimensional lattice (e.g., a square lattice, a rectangular lattice, a hexagonal lattice, a rhombohedral lattice, a centered lattice, an oblique lattice, etc.). In these implementations, the two-dimensional lattice may include first lattice sites for the plurality of cavities 116. The first lattice sites may each be occupied by an internal cavity 116. However, in some variations, only a portion of the first lattice sites is occupied. The two-dimensional lattice may also include second lattice sites for the one or more holes. The second lattice sites may each be occupied by a hole. However, in some variations, only a portion of the second lattice sites is occupied. It will be appreciated that the occupancy (or vacancy) of the first and second lattice sites may be selected to allow the internal cavities 116 and holes to be arranged in a desired pattern or array. Such selection may also allow the stack of layers 104 to define a desired shape for the body 102.

Figure 6A:
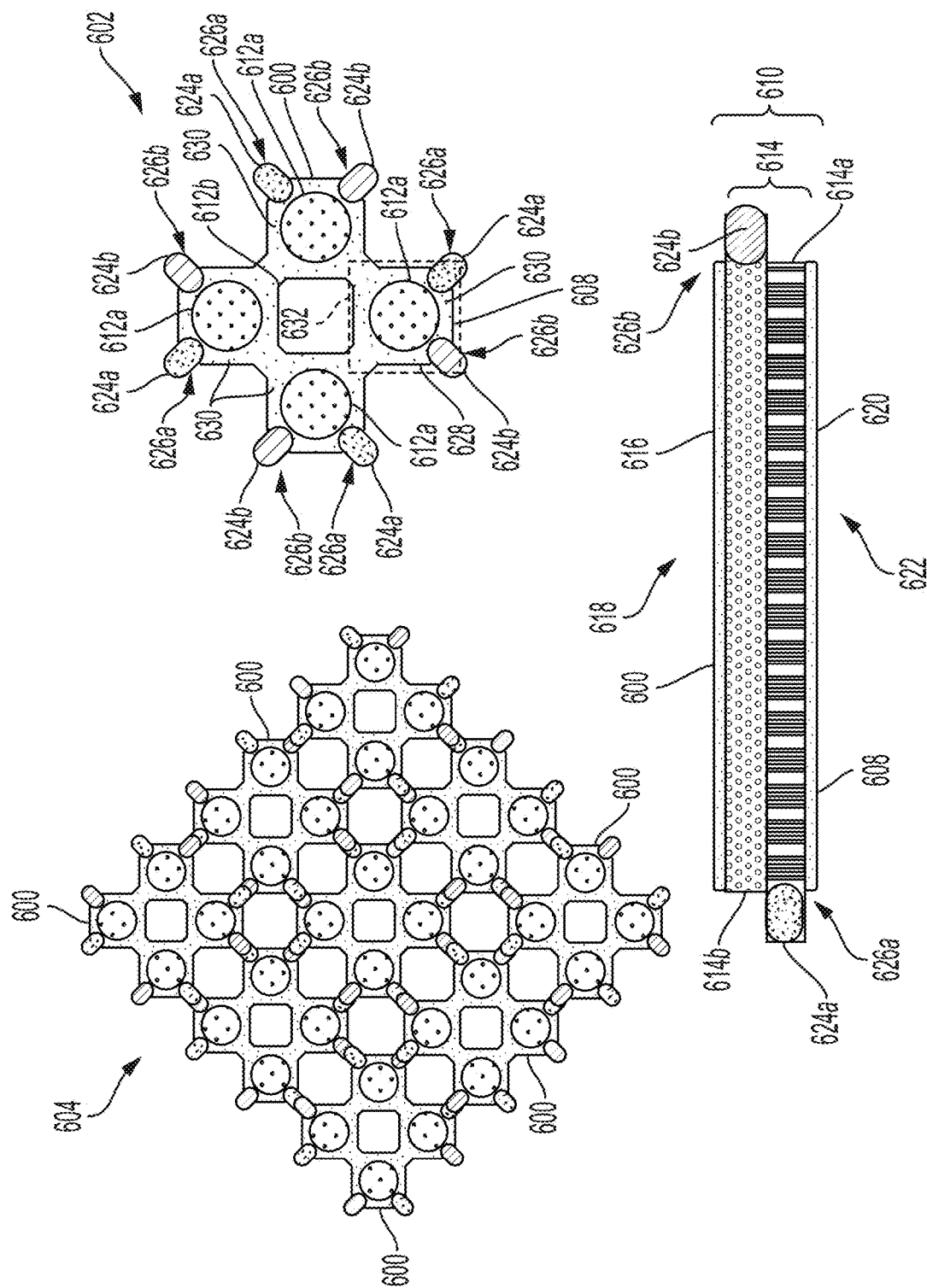
FIG. 6A is a schematic diagram of an example vapor cell having an array of cavities therein.

FIG. 6A presents a schematic diagram of an example vapor cell 600 having an array of cavities therein 612. The schematic diagram illustrates the example vapor cell 600 in the context of a unit cell 602 and as part of a tiled pattern 604 of vapor cells. The schematic diagram also illustrates a cross-section 606 of the example vapor cell 600. The example vapor cell 600 includes a body 608 defined by a stack of layers 610 bonded to each other. The stack of layers 610 defines the array of cavities 612, which includes a first subset of cavities 612a and a second subset of cavities 612b. The first subset of cavities 612a extends through intermediate layers 614 of the stack of layers 610, and the second subset of cavities 612b extends entirely through the stack of layers 610. The first subset of cavities 612a may be analogous to the internal cavity 116 described in relation to FIGS. 1A-5, and the second subset of cavities 612b may each correspond to a through-hole. A vapor or a source of the vapor is disposed in each of the first subset of cavities 612a.

The first and second subsets of cavities 612a may each share a common shape, as shown in FIG. 6A. However, in some cases, one or more of the first subset of cavities 612a can have a different shape. In some cases, one or more of the second subset of cavities 612b can also have a different shape. In many variations, the first and second subset of cavities 612a, 612b run along respective axes that are perpendicular to the stack of layers 610, although other orientations are possible (e.g., canted axes). Furthermore, although FIG. 6A depicts the first subset of cavities 612a as having a cylindrical shape and second subset of cavities 612b as having a square tubular shape, other shapes are possible (e.g., hexagonal, ellipsoidal, spherical, etc.). For example, each intermediate layer 614 may include a through-hole that defines a portion of a cavity through the intermediate layer 614. One or more intermediate layers 614 may then be selectively configured such that the intermediate layers 614, when stacked, define a target three-dimensional volume for the cavity (e.g., a sphere, a frustrum, an inclined parallelepiped, etc.). In some variations, at least two adjacent intermediate layers 614 have respective through-holes that differ, relative to each other, in one or both of shape and size. In some variations, two or more intermediate layers 614 (e.g., adjacent intermediate layers) have different thicknesses. Other configurable features are possible (e.g., angles for an inner perimeter surface that encircles the through-hole of an intermediate layer).

The stack of layers 610 includes a first end layer 616 at a first end 618 of the body 608. The first end layer 616 is formed of a first type of dielectric material that is optically transparent. The stack of layers 610 also includes a second end layer 620 at a second, opposite end 622 of the body 608. The second end layer 620 is formed of dielectric material. The intermediate layers 614 of the stack of layers 610 are positioned between the first and second end layers 616, 620 and include a first subset of layers 614a formed of the first type of dielectric material and a second subset of layers 614b formed of a second, different type of dielectric material. FIG. 6A depicts the first and second subsets of layers 614a, 614b as each being only a single layer. However, other numbers of layers are possible for one or both of the first and second subsets of layers 614a, 614b.

Figure 6B:
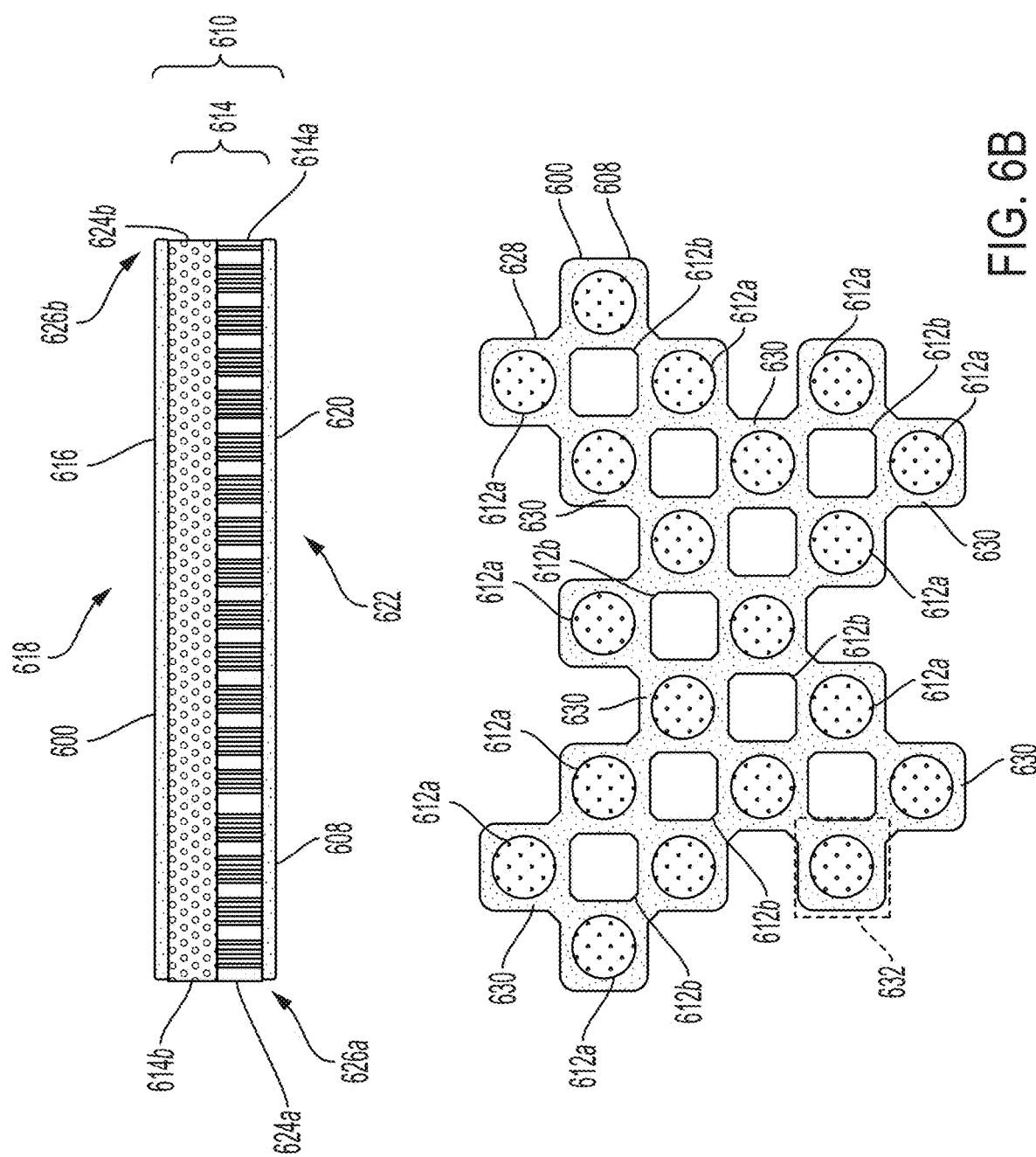
FIG. 6B is a schematic diagram of the example vapor cell of FIG. 6A, but in which intermediate layers of the example vapor cell lack tabs extending outward therefrom.

In some variations, such as shown in FIG. 6A, the stack of layers 610 includes a first set of tabs 624a extending outward from the first subset of layers 614a at a first location 626a of an exterior perimeter 628 of the body 608. The stack of layers 610 may also include a second set of tabs 624b extending outward from the second subset of layers 614b at a second location 626b of the exterior perimeter 628 of the body 608. The first and second tabs 624a, 624b may function as, respectively, first and second mechanical interfaces for interlocking with another, similarly-configured vapor cell (e.g., a second instance of the example vapor cell 600). However, in some variations, the first and second sets of layers 614a, 614b have no tabs extending therefrom. FIG. 6B presents a schematic diagram of the example vapor cell of FIG. 6A, but in which intermediate layers of the example vapor cell (e.g., the first and second sets of layers 614a, 614b) lack tabs extending outward therefrom.

In certain instances, each of the first subset of cavities 612a is encircled by a side wall 630 formed by the stack of layers 610. The side wall 630 includes a corner that defines part of the exterior perimeter 628. In such instances, the first location 626a is a first corner of the exterior perimeter 628 and the second location 626b is a second, different corner of the exterior perimeter 628. However, the first and second locations 626a, 626b can be elsewhere on the exterior perimeter 628. For example, the side wall 630 may include a flat surface that defines part of the exterior perimeter 628 (e.g., a center of an exterior side). The first location 626a may then be a first flat surface of the exterior perimeter 628 and the second location 626b is a second, different flat surface of the exterior perimeter 628.

The array of cavities 612 may be arranged according to a two-dimensional lattice. In some cases, the two-dimensional lattice includes first and second lattice sites for, respectively, the first and second subsets of cavities 612a, 612b. For example, the two-dimensional lattice may be a square lattice having first and second lattice sites that alternate in sequence along row and column directions. In this arrangement, the array of cavities 612 are disposed at respective locations of the square lattice and the first and second subset of cavities 612a, 612b alternate in sequence along rows and columns of the square lattice. In some cases, the first and second lattice sites are partially occupied by the first and second subset of cavities 612a, 612b. For example, as shown in FIG. 6, four of the first lattice sites may be occupied by respective cavities of the first subset 612a and one second lattice site may be occupied by a respective cavity of the second subset 612b. This configuration may allow the body 608 of the example vapor cell 600 to assume a plus (+) shape. However, other arrangements are possible. For example, the array of cavities 612 in the example vapor cell 600 of FIG. 6B is arranged to define a butterfly-like shape for the body 608.

In some variations, the side wall 630 has four exterior surfaces that define a square cross-section of the side wall 630. In these variations, each of the second subset of cavities 612b has a square cross-section. In some variations, the side wall 630 has one or more exterior surfaces that define an exterior unit-cell perimeter 632 of the cavity. In FIGS. 6A and 6B, only a single exterior unit-cell perimeter 632—represented by a dashed line—is shown for clarity. For one or more cavities of the first subset 612a, at least one intermediate layer 614 includes a plurality of holes between the one or more cavities and their respective exterior unit-cell perimeters 632. The plurality of holes may be analogous to those described in relation to FIGS. 1A-1B and 4A-5. For example, the plurality of holes may extend through the at least one intermediate layer 614. As another example, the example vapor cell 600 may be configured to detect a target radiation and each of the plurality of holes has a largest dimension no greater than a wavelength of the target radiation (e.g., a wavelength of at least 0.3 mm). In certain cases, one or more of the plurality of holes adjacent the one or more cavities may include a source of the vapor therein. In these embodiments, the at least one intermediate layer 614 may define a channel (or part thereof) that fluidly couples the one or more holes to the one or more cavities.

In some aspects of what is described, a vapor cell may be described by the following examples:

Example 1. A vapor cell, comprising:
   a body defined by a stack of layers bonded to each other, the stack of layers comprising:
      a first end layer at a first end of the body, the first end layer being formed of a first type of dielectric material that is optically transparent,
      a second end layer at a second, opposite end of the body, the second end layer being formed of dielectric material,
      intermediate layers between the first and second end layers and formed of dielectric material, the intermediate layers defining an internal cavity that extends through the body between the first end layer and the second end layer; and
   a vapor or a source of the vapor disposed in the internal cavity.

Example 2. The vapor cell of example 1, wherein the second end layer is formed of the first type of dielectric material.

Example 3. The vapor cell of example 1 or example 2, wherein the intermediate layers comprise:
   a first subset of layers formed of the first type of dielectric material; and
   a second subset of layers formed of a second, different type of dielectric material.

Example 4. The vapor cell of example 3, wherein the layers are ordered in the stack to alternate between the first type of dielectric material and the second type of dielectric material.

Example 5. The vapor cell of example 3 or example 4, wherein the second type of dielectric material is silicon.

Example 6. The vapor cell of example 1 or any one of examples 2-5, wherein the first type of dielectric material comprises silicon oxide.

Example 7. The vapor cell of example 1 or any one of examples 2-6, wherein the stack of layers comprises:
   a first set of tabs extending outward from the intermediate layers on a first exterior side (or location) of the body; and
   a second set of tabs extending outward from the intermediate layers on a second exterior side (or location) of the body.

Example 8. The vapor cell of example 7,
   wherein the vapor cell is a first vapor cell;
   wherein the first set of tabs defines a first mechanical interface that is configured to interlock with a second vapor cell (e.g., a second instance of the first vapor cell); and wherein the second set of tabs defines a second mechanical interface that is configured to interlock with a third vapor cell (e.g., a third instance of the first vapor cell).

Example 9. The vapor cell of example 7 or example 8,
wherein each tab of the first set is an integral part of the intermediate layer from which it extends; and
wherein each tab of the second set is an integral part of the intermediate layer from which it extends.

Example 10. The vapor cell of example 7 or any one of examples 8-9, wherein the first and second sets of tabs are aligned with respective centers of the first and second exterior sides.

Example 11. The vapor cell of example 7 or any one of examples 8-10,
wherein the intermediate layers comprise a first subset of layers and a second subset of layers that alternate in sequence along the stack of layers;
wherein each tab of the first set extends outward from a respective layer in the first subset of layers; and
wherein each tab of the second set extends outward from a respective layer in the second subset of layers.

Example 12. A plurality of vapor cells, each corresponding to the vapor cell of example 7 or any one of examples 8-11, in which the first and second sets of tabs of each vapor cell are interlocked with, respectively, the second set of tabs of a first vapor cell and the first set of tabs of a second, different vapor cell.

Example 13. The vapor cell of example 1 or any one of examples 2-12,
wherein the body has four exterior sides defining a square cross-section of the body, the four exterior sides comprising first and second exterior sides; and
wherein the stack of layers comprises:
a first set of tabs extending outward from the intermediate layers on the first exterior side of the body, and
a second set of tabs extending outward from the intermediate layers on the second exterior side of the body.

Example 14. The vapor cell of example 13, wherein the first and second exterior sides are adjacent to each other.

Example 15. The vapor cell of example 13, wherein the first and second exterior sides are opposite each other.

Example 16. The vapor cell of example 13 or any one of examples 14-15,
wherein the four exterior sides comprise third and fourth exterior sides; and
wherein the stack of layers comprises:
a third set of tabs extending outward from the intermediate layers on the third exterior side of the body, and
a fourth set of tabs extending outward from the intermediate layers on the fourth exterior side of the body.

Example 17. The vapor cell of example 16,
wherein each tab of the third set is an integral part of the intermediate layer from which it extends; and
wherein each tab of the fourth set is an integral part of the intermediate layer from which it extends.

Example 18. The vapor cell of example 16 or example 17,
wherein the first, second, third, and fourth sets of tabs are aligned with respective centers of the first, second, third, and fourth exterior sides.

Example 19. The vapor cell of example 16 or any one of examples 17-18,
wherein the intermediate layers comprise a first subset of layers and a second subset of layers that alternate in sequence along the stack of layers;
wherein each tab of the first and third sets extends outward from a respective layer in the first subset of layers; and
wherein each tab of the second and fourth sets extends outward from a respective layer in the second subset of layers.

Example 20. The vapor cell of example 1 or any one of examples 2-19,
wherein the first end layer comprises:
an interior surface covering a first opening of the internal cavity adjacent the first end layer, and
an exterior surface opposite the interior surface; and
wherein one or both of the interior and exterior surfaces have an optical coating disposed thereon.

Example 21. The vapor cell of example 20, wherein the interior surface of the first end layer comprises a reflective coating disposed thereon.

Example 22. The vapor cell of example 20 or example 21, wherein the exterior surface of the first end layer comprises a reflective coating disposed thereon.

Example 23. The vapor cell of example 20 or any one of examples 21-22, wherein the interior surface of the first end layer comprises an anti-reflective coating disposed thereon.

Example 24. The vapor cell of example 20 or any one of examples 21-23, wherein the exterior surface of the first end layer comprises an anti-reflective coating disposed thereon.

Example 25. The vapor cell of example 1 or any one of examples 2-24,
wherein the second end layer comprises:
an interior surface covering a second opening of the internal cavity adjacent the second end layer, and
an exterior surface opposite the interior surface; and
wherein one or both of the interior and exterior surfaces have an optical coating disposed thereon.

Example 26. The vapor cell of example 25, wherein the interior surface of the second end layer comprises a reflective coating disposed thereon.

Example 27. The vapor cell of example 25 or example 26, wherein the exterior surface of the second end layer comprises a reflective coating disposed thereon.

Example 28. The vapor cell of example 25 or any one of examples 26-27, wherein the interior surface of the second end layer comprises an anti-reflective coating disposed thereon.

Example 29. The vapor cell of example 25 or any one of examples 26-28, wherein the exterior surface of the second end layer comprises an anti-reflective coating disposed thereon.

Example 30. The vapor cell of example 1 or any one of examples 2-29, wherein at least one of the intermediate layers comprises a plurality of holes between the internal cavity and an outer perimeter of the intermediate layer.

Example 31. The vapor cell of example 30, wherein the plurality of holes extends through the intermediate layer.

Example 32. The vapor cell of example 30 or example 31,
wherein the vapor cell is configured to detect a target radiation; and
wherein each of the plurality of holes has a largest dimension no greater than a wavelength of the target radiation.

Example 33. The vapor cell of example 32, wherein the target radiation has a wavelength of at least 0.3 mm.

Example 34. The vapor cell of example 1 or any one of examples 2-33, wherein an interface between at least one pair of adjacent layers in the stack comprises an adhesion layer.

Example 35. The vapor cell of example 34, wherein the adhesion layer comprises silicon oxide.

Example 36. The vapor cell of example 1 or any one of examples 2-35,
wherein each intermediate layer comprises a through-hole that defines a portion of the internal cavity through the intermediate layer; and
wherein at least two adjacent intermediate layers have respective through-holes that differ, relative to each other, in one or both of shape and size.

In some aspects of what is described, a method of manufacturing a vapor cell may be described by the following examples:

Example 37. A method of manufacturing a vapor cell, the method comprising:
obtaining a stack of layers bonded to each other and comprising:
a first end layer formed of a first type of dielectric material that is optically transparent, and
intermediate layers formed of dielectric material and extending in sequence from a first intermediate layer to a last intermediate layer, wherein:
the first intermediate layer is bonded to the first end layer, and
an internal cavity extends through the intermediate layers and comprises an opening defined by a surface of the last intermediate layer;
disposing a vapor or a source of the vapor into the internal cavity; and
bonding a second end layer of the stack of layers to the last intermediate layer to seal the vapor or the source of the vapor in the internal cavity, the second end layer formed of dielectric material;
wherein the stack of layers, when comprising the bonded second end layer, defines a body of the vapor cell, the first end layer at a first end of the body and the second end layer at a second, opposite end of the body.

Example 38. The method of example 37, wherein bonding the second end layer comprises covering the opening of the internal cavity with the second end layer to enclose the vapor or the source of the vapor in the internal cavity.

Example 39. The method of example 37 or example 38, wherein the second end layer is formed of the first type of dielectric material.

Example 40. The method of example 37 or any one of examples 38-39, wherein the first type of dielectric material comprises silicon oxide.

Example 41. The method of example 37 or any one of examples 38-40, wherein obtaining the stack of layers comprises:
removing material from a first wafer formed of the first type of dielectric material to fabricate the first end layer, the second end layer (when combined with Example 39), or both; and
removing material from a second wafer formed of dielectric material to fabricate the intermediate layers.

Example 42. The method of example 37 or any one of examples 38-40, wherein the intermediate layers comprise:
a first subset of layers formed of the first type of dielectric material; and
a second subset of layers formed of a second, different type of dielectric material.

Example 43. The method of example 42, wherein obtaining the stack of layers comprises:
alternately bonding layers of the first and second subset of layers to each other to form the intermediate layers; and
bonding the first intermediate layer to the first end layer.

Example 44. The method of example 42 or example 43, wherein obtaining the stack of layers comprises:
removing material from a first wafer formed of the first type of dielectric material to fabricate the first end layer, one or more of the first subset of layers, the second end layer (when combined with Example 39), or any combination thereof; and
removing material from a second wafer formed of the second type of dielectric material to fabricate one or more of the second subset of layers.

Example 45. The method of example 42 or any one of examples 43-44, wherein the second type of dielectric material is silicon.

Example 46. The method of example 37 or any one of examples 38-45, wherein bonding the second end layer comprises:
altering the surface of the last intermediate layer to comprise a first plurality of hydroxyl ligands;
altering a surface of the second end layer to comprise a second plurality of hydroxyl ligands; and
contacting the altered surfaces to form a seal around the opening of the internal cavity, the seal defined by metal-oxygen bonds formed by reacting the first plurality of hydroxyl ligands with the second plurality of hydroxyl ligands during contact of the two altered surfaces.

Example 47. The method of example 46, wherein bonding the second end layer comprises:
activating one or both of the surfaces of the last intermediate layer and the second end layer by exposing their respective surfaces to a plasma.

Example 48. The method of example 37 or any one of examples 38-47, wherein at least one of the intermediate layers comprises a plurality of the holes between the internal cavity and an outer perimeter of the intermediate layer.

Example 49. The method of example 48, wherein the plurality of holes extends through the intermediate layer.

Example 50. The method of example 48 or example 49,
wherein the vapor cell, when manufactured, is configured to detect a target radiation; and
wherein each of the plurality of holes has a largest dimension no greater than a wavelength of the target radiation.

Example 51. The method of example 50, wherein the target radiation has a wavelength of at least 0.3 mm.

Example 52. The method of example 37 or any one of examples 38-51, wherein obtaining the stack of layers comprises:
forming an adhesion layer on one or both sides of an intermediate layer to define respective bonding surfaces of the intermediate layer.

Example 53. The method of example 52, wherein the adhesion layer comprises silicon oxide.

Example 54. The method of example 37 or any one of examples 38-53, wherein the stack of layers comprises:
a first set of tabs extending outward from the intermediate layers on a first exterior side (or location) of the stack of layers (or body of the vapor cell); and
a second set of tabs extending outward from the intermediate layers on a second exterior side (or location) of the stack of layers (or body of the vapor cell).

Example 55. The method of example 54,
  wherein the vapor cell is a first vapor cell;
  wherein the first set of tabs defines a first mechanical interface that is configured to interlock with a second vapor cell (e.g., a second instance of the first vapor cell); and
  wherein the second set of tabs defines a second mechanical interface that is configured to interlock with a third vapor cell (e.g., a third instance of the first vapor cell).

In some aspects of what is described, a vapor cell system may be described by the following examples:

Example 56. A vapor cell system comprising:
  an array of interlocked vapor cells, each interlocked vapor cell comprising:
    a stack of layers bonded to each other and defining a body of the interlocked vapor cell, the stack of layers comprising:
      a first end layer at a first end of the body, the first end layer being formed of a first type of dielectric material that is optically transparent,
      a second end layer at a second, opposite end of the body, the second end layer being formed of dielectric material, and
      one or more intermediate layers between the first and second end layers and formed of dielectric material, the one or more intermediate layers defining an internal cavity that extends through the stack of layers between the first end layer and the second end layer,
    a first mechanical interface on a first exterior side of the body,
    a second mechanical interface on a second exterior side of the body, and
    a vapor or a source of the vapor disposed in the internal cavity;
  wherein the first mechanical interface of at least one interlocked vapor cell is interlocked with the second mechanical interface of another interlocked vapor cell; and
  wherein the second mechanical interface of the at least one interlocked vapor cell is interlocked with the first mechanical interface of another, different interlocked vapor cell.

Example 57. The vapor cell system of example 56, wherein the second end layer is formed of the first type of dielectric material.

Example 58. The vapor cell system of example 56 or example 57, wherein the one or more intermediate layers comprise at least one layer formed of a second, different type of dielectric material.

Example 59. The vapor cell system of example 56 or example 57, wherein the one or more intermediate layers comprise:
  a first subset of layers formed of the first type of dielectric material, and
  a second subset of layers formed of a second, different type of dielectric material.

Example 60. The vapor cell system of example 59, wherein the layers are ordered in the stack to alternate between the first type of dielectric material and the second type of dielectric material.

Example 61. The vapor cell system of example 58 or any one of examples 59-60, wherein the second type of dielectric material is silicon.

Example 62. The vapor cell system of example 56 or any one of examples 57-61, wherein the first type of dielectric material comprises silicon oxide.

Example 63. The vapor cell system of example 56 or any one of examples 57-62,
  wherein the first mechanical interface comprises a first set of tabs extending outward from the one or more intermediate layers on the first exterior side (or location) of the body; and
  wherein the second mechanical interface comprises a second set of tabs extending outward from the one or more intermediate layers on the second exterior side (or location) of the body.

Example 64. The vapor cell system of example 63,
  wherein each tab of the first set is an integral part of the intermediate layer from which it extends; and
  wherein each tab of the second set is an integral part of the intermediate layer from which it extends.

Example 65. The vapor cell system of example 63 or example 64, wherein the first and second sets of tabs are aligned with respective centers of the first and second exterior sides.

Example 66. The vapor cell system of example 63 or any one of examples 64-65,
  wherein the one or more intermediate layers comprise a first subset of layers and a second subset of layers that alternate in sequence along the stack of layers;
  wherein each tab of the first set extends outward from a respective layer in the first subset of layers; and
  wherein each tab of the second set extends outward from a respective layer in the second subset of layers.

Example 67. The vapor cell system of example 56 or any one of examples 57-66, wherein the body of the interlocked vapor cell has four exterior sides defining a square cross-section of the body, the four exterior sides comprising the first and second exterior sides.

Example 68. The vapor cell system of example 67, wherein the first and second exterior sides are adjacent to each other.

Example 69. The vapor cell system of example 67, wherein the first and second exterior sides are opposite each other.

Example 70. The vapor cell system of example 67 or any one of examples 68-69,
  wherein the four exterior sides comprise third and fourth exterior sides; and
  wherein each interlocked vapor cell comprises:
    a third mechanical interface on the third exterior side of the body, and
    a fourth mechanical interface on the fourth exterior side of the body.

Example 71. The vapor cell system of example 70,
  wherein the third mechanical interface comprises a third set of tabs extending outward from the one or more intermediate layers on the third exterior side of the body; and
  wherein the fourth mechanical interface comprises a fourth set of tabs extending outward from the one or more intermediate layers on the fourth exterior side of the body.

Example 72. The vapor cell system of example 71,
  wherein each tab of the third set is an integral part of the intermediate layer from which it extends; and
  wherein each tab of the fourth set is an integral part of the intermediate layer from which it extends.

Example 73. The vapor cell system of example 71 or example 72, wherein the third and fourth sets of tabs are aligned with respective centers of the third and fourth exterior sides.

Example 74. The vapor cell system of example 71 or any one of examples 72-73,
  wherein the one or more intermediate layers comprise a first subset of layers and a second subset of layers that alternate in sequence along the stack of layers;
  wherein each tab of the third set extends outward from a respective layer in the first subset of layers; and
  wherein each tab of the fourth set extends outward from a respective layer in the second subset of layers.
Example 75. The vapor cell system of example 56 or any one of examples 57-74,
  wherein the first end layer comprises:
    an interior surface covering a first opening of the internal cavity adjacent the first end layer, and
    an exterior surface opposite the interior surface; and
  wherein one or both of the interior and exterior surfaces have an optical coating disposed thereon.
Example 76. The vapor cell system of example 75, wherein the interior surface of the first end layer comprises a reflective coating disposed thereon.
Example 77. The vapor cell system of example 75 or example 76, wherein the exterior surface of the first end layer comprises a reflective coating disposed thereon.
Example 78. The vapor cell system of example 75 or any one of examples 76-77, wherein the interior surface of the first end layer comprises an anti-reflective coating disposed thereon.
Example 79. The vapor cell system of example 75 or any one of examples 76-78, wherein the exterior surface of the first end layer comprises an anti-reflective coating disposed thereon.
Example 80. The vapor cell system of example 56 or any one of examples 57-79,
  wherein the second end layer comprises:
    an interior surface covering a second opening of the internal cavity adjacent the second end layer, and
    an exterior surface opposite the interior surface; and
  wherein one or both of the interior and exterior surfaces have an optical coating disposed thereon.
Example 81. The vapor cell system of example 80, wherein the interior surface of the second end layer comprises a reflective coating disposed thereon.
Example 82. The vapor cell system of example 80 or example 81, wherein the exterior surface of the second end layer comprises a reflective coating disposed thereon.
Example 83. The vapor cell system of example 80 or any one of examples 81-82, wherein the interior surface of the second end layer comprises an anti-reflective coating disposed thereon.
Example 84. The vapor cell system of example 80 or any one of examples 81-83, wherein the exterior surface of the second end layer comprises an anti-reflective coating disposed thereon.
Example 85. The vapor cell system of example 56 or any one of examples 57-84, wherein the one or more intermediate layers comprise at least one layer having a plurality of holes between the internal cavity and an outer perimeter of the intermediate layer.
Example 86. The vapor cell system of example 85, wherein the plurality of holes extends through the intermediate layer.
Example 87. The vapor cell system of example 85 or example 86,
  wherein each interlocked vapor cell is configured to detect a respective target radiation; and
  wherein the plurality of holes associated with an interlocked vapor cell each have a largest dimension no greater than a wavelength of the target radiation of the interlocked vapor cell.
Example 88. The vapor cell system of example 87, wherein the target radiation has a wavelength of at least 0.3 mm.
Example 89. The vapor cell system of example 56 or any one of examples 57-88, wherein an interface between at least one pair of adjacent layers in the stack comprises an adhesion layer.
Example 90. The vapor cell system of example 89, wherein the adhesion layer comprises silicon oxide.
Example 91. The vapor cell system of example 56 or any one of examples 57-90,
  wherein each intermediate layer comprises a through-hole that defines a portion of the internal cavity through the intermediate layer; and
  wherein at least two adjacent intermediate layers have respective through-holes that differ, relative to each other, in one or both of shape and size.

In some aspects of what is described, a vapor cell may be described by the following examples:
Example 92. A vapor cell, comprising:
  a body defined by a stack of layers bonded to each other, the stack of layers defining an array of cavities that comprises a first subset of cavities and a second subset of cavities, the first subset of cavities extending through intermediate layers of the stack of layers, the second subset of cavities extending entirely through the stack of layers; and
  a vapor or a source of the vapor disposed in each of the first subset of cavities;
  wherein the stack of layers comprises:
    a first end layer at a first end of the body, the first end layer being formed of a first type of dielectric material that is optically transparent;
    a second end layer at a second, opposite end of the body, the second end layer being formed of dielectric material;
    the intermediate layers, positioned between the first and second end layers and formed of dielectric material.
Example 93. The vapor cell of example 92,
  wherein the array of cavities reside at respective locations defined by a two-dimensional lattice, the two dimensional lattice comprising first and second lattice sites; and
  wherein the first subset of cavities occupy respective first lattice sites and the second subset of cavities occupy respective second lattice sites.
Example 94. The vapor cell of example 93, wherein all of the first lattice sites are occupied by respective cavities of the first subset and all of the second lattice sites are occupied by respective cavities of the second subset.
Example 95. The vapor cell of example 93 or example 94, wherein the two dimensional lattice is a square lattice and the first and second lattice sites alternate in sequence along rows and columns of the square lattice.
Example 96. The vapor cell of example 92, wherein the array of cavities reside at respective locations of a square lattice and the first and second subset of cavities alternate in sequence along rows and columns of the square lattice.
Example 97. The vapor cell of example 92 or any one of examples 93-95,
  wherein each cavity of the first subset is encircled by a side wall formed by the stack of layers, the side wall having four exterior surfaces that define a square cross-section of the side wall; and wherein each cavity of the second subset has a square cross-section.

Example 98. The vapor cell of example 92 or any one of examples 93-97, wherein the second end layer is formed of the first type of dielectric material.

Example 99. The vapor cell of example 92 or any one of examples 93-98, wherein the intermediate layers comprise:
a first subset of layers formed of the first type of dielectric material; and
a second subset of layers formed of a second, different type of dielectric material.

Example 100. The vapor cell of example 99, wherein the layers are ordered in the stack to alternate between the first type of dielectric material and the second type of dielectric material.

Example 101. The vapor cell of example 99 or example 100, wherein the second type of dielectric material is silicon.

Example 102. The vapor cell of example 92 or any one of examples 93-101, wherein the first type of dielectric material comprises silicon oxide.

Example 103. The vapor cell of example 92 or any one of examples 93-102, wherein the stack of layers comprises:
a first set of tabs extending outward from the intermediate layers at a first location of an exterior perimeter of the body; and
a second set of tabs extending outward from the intermediate layers at a second location of the exterior perimeter of the body.

Example 104. The vapor cell of example 103,
wherein each cavity of the first subset is encircled by a side wall formed by the stack of layers, the side wall comprising a corner that defines part of the exterior perimeter of the body; and
wherein the first location is a first corner of the exterior perimeter of the body and the second location is a second, different corner of the exterior perimeter of the body.

Example 105. The vapor cell of example 103,
wherein each cavity of the first subset is encircled by a side wall formed by the stack of layers, the side wall comprising a flat surface that defines part of the exterior perimeter of the body; and
wherein the first location is a first flat surface of the exterior perimeter of the body and the second location is a second, different flat surface of the exterior perimeter of the body.

Example 106. The vapor cell of example 103 or any one of examples 104-105,
wherein the vapor cell is a first vapor cell;
wherein the first set of tabs defines a first mechanical interface that is configured to interlock with a second vapor cell (e.g., a second instance of the first vapor cell); and
wherein the second set of tabs defines a second mechanical interface that is configured to interlock with a third vapor cell (e.g., a third instance of the first vapor cell).

Example 107. The vapor cell of example 103 or any one of examples 104-106,
wherein each tab of the first set is an integral part of the intermediate layer from which it extends; and
wherein each tab of the second set is an integral part of the intermediate layer from which it extends.

Example 108. The vapor cell of example 103 or any one of examples 104-107,
wherein the intermediate layers comprise a first subset of layers and a second subset of layers that alternate in sequence along the stack of layers;
wherein each tab of the first set extends outward from a respective layer in the first subset of layers; and
wherein each tab of the second set extends outward from a respective layer in the second subset of layers.

Example 109. A plurality of vapor cells, each corresponding to the vapor cell of example 103 or any one of examples 104-108, in which the first and second sets of tabs of each vapor cell are interlocked with, respectively, the second set of tabs of a first vapor cell and the first set of tabs of a second, different vapor cell.

Example 110. The vapor cell of example 92 or any one of examples 93-109,
wherein each cavity of the first subset has a first opening adjacent the first end layer;
wherein the first end layer comprises:
an interior surface covering the first openings of the first subset of cavities, and
an exterior surface opposite the interior surface; and
wherein one or both of the interior and exterior surfaces have an optical coating disposed thereon.

Example 111. The vapor cell of example 110, wherein the interior surface of the first end layer comprises a reflective coating disposed thereon.

Example 112. The vapor cell of example 110 or example 111, wherein the exterior surface of the first end layer comprises a reflective coating disposed thereon.

Example 113. The vapor cell of example 110 or any one of examples 111-112, wherein the interior surface of the first end layer comprises an anti-reflective coating disposed thereon.

Example 114. The vapor cell of example 110 or any one of examples 111-113, wherein the exterior surface of the first end layer comprises an anti-reflective coating disposed thereon.

Example 115. The vapor cell of example 92 or any one of examples 93-114,
wherein each cavity of the first subset has a second opening adjacent the second end layer;
wherein the second end layer comprises:
an interior surface covering the second openings of the first subset of cavities, and
an exterior surface opposite the interior surface; and
wherein one or both of the interior and exterior surfaces have an optical coating disposed thereon.

Example 116. The vapor cell of example 115, wherein the interior surface of the second end layer comprises a reflective coating disposed thereon.

Example 117. The vapor cell of example 115 or example 116, wherein the exterior surface of the second end layer comprises a reflective coating disposed thereon.

Example 118. The vapor cell of example 115 or any one of examples 116-117, wherein the interior surface of the second end layer comprises an anti-reflective coating disposed thereon.

Example 119. The vapor cell of example 115 or any one of examples 116-118, wherein the exterior surface of the second end layer comprises an anti-reflective coating disposed thereon.

Example 120. The vapor cell of example 92 or any one of examples 93-119,
wherein each cavity of the first subset is encircled by a side wall formed by the stack of layers, the side wall having one or more exterior surfaces that define at least part of an exterior unit-cell perimeter that encircles the cavity; and wherein, for one or more cavities of the first subset, at least one intermediate layer comprises a plurality of holes between the one or more cavities and their respective exterior unit-cell perimeters.

Example 121. The vapor cell of example 120, wherein the plurality of holes extends through the at least one intermediate layer.

Example 122. The vapor cell of example 120 or example 121, wherein the vapor cell is configured to detect a target radiation; and wherein each of the plurality of holes has a largest dimension no greater than a wavelength of the target radiation.

Example 123. The vapor cell of example 122, wherein the target radiation has a wavelength of at least 0.3 mm.

Example 124. The vapor cell of example 92 or any one of examples 93-123, wherein an interface between at least one pair of adjacent layers in the stack comprises an adhesion layer.

Example 125. The vapor cell of example 124, wherein the adhesion layer comprises silicon oxide.

Example 126. The vapor cell of example 92 or any one of examples 93-125, wherein each intermediate layer comprises a through-hole that defines a portion of a cavity of the first subset through the intermediate layer; and wherein at least two adjacent intermediate layers have respective through-holes for the cavity of the first subset that differ, relative to each other, in one or both of shape and size.

Example 127. The vapor cell of example 92 or any one of examples 93-126, wherein each intermediate layer comprises a through-hole that defines a portion of a cavity of the second subset through the intermediate layer; and wherein at least two adjacent intermediate layers have respective through-holes for the cavity of the second subset that differ, relative to each other, in one or both of shape and size.

In some aspects of what is described, a method of manufacturing a vapor cell may be described by the following examples:

Example 128. A method of manufacturing a vapor cell, the method comprising:

obtaining a stack of layers bonded to each other and defining an array of cavities that comprises a first subset of cavities and a second subset of cavities, the first subset of cavities extending through intermediate layers of stack of layers, the second subset of cavities extending entirely through the stack of layers, the stack of layers comprising:

a first end layer formed of a first type of dielectric material that is optically transparent, and the intermediate layers, formed of dielectric material and extending in sequence from a first intermediate layer to a last intermediate layer, wherein:

the first intermediate layer is bonded to the first end layer, and each of the first subset of cavities comprises an opening defined by a surface of the last intermediate layer;

disposing a vapor or a source of the vapor into each of the first subset of cavities; and bonding a second end layer of the stack of layers to the last intermediate layer to seal the vapor or the source of the vapor in the first subset of cavities, the second end layer formed of dielectric material;

wherein each cavity of the second subset extends through the second end layer; and wherein the stack of layers, when comprising the bonded second end layer, defines a body of the vapor cell, the first end layer at a first end of the body and the second end layer at a second, opposite end of the body.

Example 129. The method of example 128, wherein bonding the second end layer comprises covering each opening of the first subset of cavities with the second end layer to enclose the vapor or the source of the vapor in the first subset of cavities.

Example 130. The method of example 128 or example 129, wherein the second end layer is formed of the first type of dielectric material.

Example 131. The method of example 128 or any one of examples 129-130, wherein the first type of dielectric material comprises silicon oxide.

Example 132. The method of example 128 or any one of examples 129-131, wherein obtaining the stack of layers comprises:

removing material from a first wafer formed of the first type of dielectric material to fabricate the first end layer, the second end layer (when combined with Example 130), or both; and removing material from a second wafer formed of dielectric material to fabricate the intermediate layers.

Example 133. The method of example 128 or any one of examples 129-131, wherein the intermediate layers comprise:

a first subset of layers formed of the first type of dielectric material; and a second subset of layers formed of a second, different type of dielectric material.

Example 134. The method of example 133, wherein obtaining the stack of layers comprises:

alternately bonding layers of the first and second subset of layers to each other to form the intermediate layers; and bonding the first intermediate layer to the first end layer.

Example 135. The method of example 133 or example 134, wherein obtaining the stack of layers comprises:

removing material from a first wafer formed of the first type of dielectric material to fabricate the first end layer, one or more of the first subset of layers, the second end layer (when combined with Example 130), or any combination thereof; and removing material from a second wafer formed of the second type of dielectric material to fabricate one or more of the second subset of layers.

Example 136. The method of example 133 or any one of examples 134-135, wherein the second type of dielectric material is silicon.

Example 137. The method of example 128 or any one of examples 129-136, wherein bonding the second end layer comprises:

altering the surface of the last intermediate layer to comprise a first plurality of hydroxyl ligands;

altering a surface of the second end layer to comprise a second plurality of hydroxyl ligands; and contacting the altered surfaces to form a seal around each opening of the first subset of cavities, the seal defined by metal-oxygen bonds formed by reacting the first plurality of hydroxyl ligands with the second plurality of hydroxyl ligands during contact of the two altered surfaces.

Example 138. The method of example 137, wherein bonding the second end layer comprises:
activating one or both of the surfaces of the last intermediate layer and the second end layer by exposing their respective surfaces to a plasma.

Example 139. The method of example 128 or any one of examples 129-138,
wherein each cavity of the first subset is encircled by a side wall formed by the stack of layers, the side wall having one or more exterior surfaces that define at least part of an exterior unit-cell perimeter that encircles the cavity; and
wherein, for one or more cavities of the first subset, at least one intermediate layer comprises a plurality of holes between the one or more cavities and their respective exterior unit-cell perimeters.

Example 140. The method of example 139, wherein the plurality of holes extends through the at least one intermediate layer.

Example 141. The method of example 139 or example 140,
wherein the vapor cell, when manufactured, is configured to detect a target radiation; and
wherein each of the plurality of holes has a largest dimension no greater than a wavelength of the target radiation.

Example 142. The method of example 141, wherein the target radiation has a wavelength of at least 0.3 mm.

Example 143. The method of example 128 or any one of examples 129-142, wherein obtaining the stack of layers comprises:
forming an adhesion layer on one or both sides of an intermediate layer to define respective bonding surfaces of the intermediate layer.

Example 144. The method of example 143, wherein the adhesion layer comprises silicon oxide.

Example 145. The method of example 128 or any one of examples 129-144, wherein the stack of layers comprises:
a first set of tabs extending outward from the intermediate layers at a first location of an exterior perimeter of the stack of layers (or body of the vapor cell); and
a second set of tabs extending outward from the intermediate layers at a second location of the exterior perimeter of the stack of layers (or body of the vapor cell).

Example 146. The method of example 145,
wherein the vapor cell is a first vapor cell;
wherein the first set of tabs defines a first mechanical interface that is configured to interlock with a second vapor cell (e.g., a second instance of the first vapor cell); and
wherein the second set of tabs defines a second mechanical interface that is configured to interlock with a third vapor cell (e.g., a third instance of the first vapor cell).

In some aspects of what is described, a vapor cell may be described by the following examples:

Example 147. A vapor cell, comprising:
a body defined by a stack of layers bonded to each other, the stack of layers comprising:
a first end layer at a first end of the body, the first end layer being formed of a first type of dielectric material that is optically transparent,
a second end layer at a second, opposite end of the body, the second end layer being formed of dielectric material,
intermediate layers between the first and second end layers and formed of dielectric material, wherein:
the intermediate layers define an internal cavity that extends through the body between the first end layer and the second end layer, and
each intermediate layer comprises a through-hole that defines a portion of the internal cavity through the intermediate layer; and
a vapor or a source of the vapor disposed in the internal cavity.

Example 148. The vapor cell of example 147, wherein each through-hole is identical in shape and size.

Example 149. The vapor cell of example 147, wherein at least two adjacent intermediate layers have respective through-holes that differ, relative to each other, in one or both of shape and size.

Example 150. The vapor cell of example 147,
wherein the through-holes are circular and are aligned along a direction perpendicular to the stack of layers; and
wherein the through-holes vary in size to define a spherical volume for the internal cavity.

Example 151. The vapor cell of example 147 or any one of examples 148-150, wherein the second end layer is formed of the first type of dielectric material.

Example 152. The vapor cell of example 147 or any one of examples 148-151, wherein the intermediate layers comprise:
a first subset of layers formed of the first type of dielectric material; and
a second subset of layers formed of a second, different type of dielectric material.

Example 153. The vapor cell of example 152, wherein the layers are ordered in the stack to alternate between the first type of dielectric material and the second type of dielectric material.

Example 154. The vapor cell of example 152 or example 153, wherein the second type of dielectric material is silicon.

Example 155. The vapor cell of example 147 or any one of examples 148-154, wherein the first type of dielectric material comprises silicon oxide.

Example 156. The vapor cell of example 147 or any one of examples 148-155, wherein the stack of layers comprises:
a first set of tabs extending outward from the intermediate layers on a first exterior side (or location) of the body; and
a second set of tabs extending outward from the intermediate layers on a second exterior side (or location) of the body.

Example 157. The vapor cell of example 156,
wherein the vapor cell is a first vapor cell;
wherein the first set of tabs defines a first mechanical interface that is configured to interlock with a second vapor cell (e.g., a second instance of the first vapor cell); and
wherein the second set of tabs defines a second mechanical interface that is configured to interlock with a third vapor cell (e.g., a third instance of the first vapor cell).

Example 158. The vapor cell of example 156 or example 157,
wherein each tab of the first set is an integral part of the intermediate layer from which it extends; and
wherein each tab of the second set is an integral part of the intermediate layer from which it extends.

Example 159. The vapor cell of example 156 or any one of examples 157-158, wherein the first and second sets of tabs are aligned with respective centers of the first and second exterior sides.

Example 160. The vapor cell of example 156 or any one of examples 157-159,
wherein the intermediate layers comprise a first subset of layers and a second subset of layers that alternate in sequence along the stack of layers;
wherein each tab of the first set extends outward from a respective layer in the first subset of layers; and
wherein each tab of the second set extends outward from a respective layer in the second subset of layers.

Example 161. A plurality of vapor cells, each corresponding to the vapor cell of example 156 or any one of examples 157-160, in which the first and second sets of tabs of each vapor cell are interlocked with, respectively, the second set of tabs of a first vapor cell and the first set of tabs of a second, different vapor cell.

Example 162. The vapor cell of example 147 or any one of examples 148-161,
wherein the body has four exterior sides defining a square cross-section of the body, the four exterior sides comprising first and second exterior sides; and
wherein the stack of layers comprises:
a first set of tabs extending outward from the intermediate layers on the first exterior side of the body, and
a second set of tabs extending outward from the intermediate layers on the second exterior side of the body.

Example 163. The vapor cell of example 162, wherein the first and second exterior sides are adjacent to each other.

Example 164. The vapor cell of example 162, wherein the first and second exterior sides are opposite each other.

Example 165. The vapor cell of example 162 or any one of examples 163-164,
wherein the four exterior sides comprise third and fourth exterior sides; and
wherein the stack of layers comprises:
a third set of tabs extending outward from the intermediate layers on the third exterior side of the body, and
a fourth set of tabs extending outward from the intermediate layers on the fourth exterior side of the body.

Example 166. The vapor cell of example 165,
wherein each tab of the third set is an integral part of the intermediate layer from which it extends; and
wherein each tab of the fourth set is an integral part of the intermediate layer from which it extends.

Example 167. The vapor cell of example 165 or example 166, wherein the first, second, third, and fourth sets of tabs are aligned with respective centers of the first, second, third, and fourth exterior sides.

Example 168. The vapor cell of example 165 or any one of examples 166-167,
wherein the intermediate layers comprise a first subset of layers and a second subset of layers that alternate in sequence along the stack of layers;
wherein each tab of the first and third sets extends outward from a respective layer in the first subset of layers; and
wherein each tab of the second and fourth sets extends outward from a respective layer in the second subset of layers.

Example 169. The vapor cell of example 147 or any one of examples 148-168,
wherein the first end layer comprises:
an interior surface covering a first opening of the internal cavity adjacent the first end layer, and
an exterior surface opposite the interior surface; and
wherein one or both of the interior and exterior surfaces have an optical coating disposed thereon.

Example 170. The vapor cell of example 169, wherein the interior surface of the first end layer comprises a reflective coating disposed thereon.

Example 171. The vapor cell of example 169 or example 170, wherein the exterior surface of the first end layer comprises a reflective coating disposed thereon.

Example 172. The vapor cell of example 169 or any one of examples 170-171, wherein the interior surface of the first end layer comprises an anti-reflective coating disposed thereon.

Example 173. The vapor cell of example 169 or any one of examples 170-172, wherein the exterior surface of the first end layer comprises an anti-reflective coating disposed thereon.

Example 174. The vapor cell of example 147 or any one of examples 148-173,
wherein the second end layer comprises:
an interior surface covering a second opening of the internal cavity adjacent the second end layer, and
an exterior surface opposite the interior surface; and
wherein one or both of the interior and exterior surfaces have an optical coating disposed thereon.

Example 175. The vapor cell of example 174, wherein the interior surface of the second end layer comprises a reflective coating disposed thereon.

Example 176. The vapor cell of example 174 or example 175, wherein the exterior surface of the second end layer comprises a reflective coating disposed thereon.

Example 177. The vapor cell of example 174 or any one of examples 175-176, wherein the interior surface of the second end layer comprises an anti-reflective coating disposed thereon.

Example 178. The vapor cell of example 174 or any one of examples 175-177, wherein the exterior surface of the second end layer comprises an anti-reflective coating disposed thereon.

Example 179. The vapor cell of example 147 or any one of examples 148-178, wherein at least one of the intermediate layers comprises a plurality of holes between the internal cavity and an outer perimeter of the intermediate layer.

Example 180. The vapor cell of example 179, wherein the plurality of holes extends through the intermediate layer.

Example 181. The vapor cell of example 179 or example 180,
wherein the vapor cell is configured to detect a target radiation; and
wherein each of the plurality of holes has a largest dimension no greater than a wavelength of the target radiation.

Example 182. The vapor cell of example 181, wherein the target radiation has a wavelength of at least 0.3 mm.

Example 183. The vapor cell of example 147 or any one of examples 148-182, wherein an interface between at least one pair of adjacent layers in the stack comprises an adhesion layer.

Example 184. The vapor cell of example 183, wherein the adhesion layer comprises silicon oxide.

Example 185. The vapor cell of example 147 or any one of examples 148-184,
  wherein the body comprises an outer shape; and
  wherein each layer in the stack comprises an outer perimeter surface that defines a cross-section of an outer shape at a location of the layer.
Example 186. The vapor cell of example 185, wherein the cross-section of the outer shape is constant along the stack of layers.
Example 187. The vapor cell of example 185, wherein at least two adjacent intermediate layers have respective outer perimeter surfaces that differ, relative to each other, in one or both of shape and size.
Example 188. The vapor cell of example 185 (but excluding the features of Examples 162-168), wherein the cross-section is circular in shape and varies in size along the stack of layers to define an outer spherical shape for the body.

In some aspects of what is described, a method of manufacturing a vapor cell may be described by the following examples:

Example 189. A method of manufacturing a vapor cell, the method comprising:
  obtaining a stack of layers bonded to each other and comprising:
    a first end layer formed of a first type of dielectric material that is optically transparent,
    intermediate layers formed of dielectric material and extending in sequence from a first intermediate layer to a last intermediate layer, wherein:
      the first intermediate layer is bonded to the first end layer,
      an internal cavity extends through the intermediate layers and comprises an opening defined by a surface of the last intermediate layer, and
      each intermediate layer comprises a through-hole that defines a portion of the internal cavity through the intermediate layer; and
  disposing a vapor or a source of the vapor into the internal cavity; and
  bonding a second end layer of the stack of layers to the last intermediate layer to seal the vapor or the source of the vapor in the internal cavity, the second end layer formed of dielectric material;
  wherein the stack of layers, when comprising the bonded second end layer, defines a body of the vapor cell, the first end layer at a first end of the body and the second end layer at a second, opposite end of the body.
Example 190. The method of example 189, wherein each through-hole is identical in shape and size.
Example 191. The method of example 189, wherein at least two adjacent intermediate layers have respective through-holes that differ, relative to each other, in one or both of shape and size.
Example 192. The method of example 191,
  wherein the through-holes are circular and are aligned along a direction perpendicular to the stack of layers; and
  wherein the through-holes vary in size to define a spherical volume for the internal cavity.
Example 193. The method of example 189 or any one of examples 190-192, wherein bonding the second end layer comprises covering the opening of the internal cavity with the second end layer to enclose the vapor or the source of the vapor in the internal cavity.
Example 194. The method of example 189 or any one of examples 190-193, wherein the second end layer is formed of the first type of dielectric material.
Example 195. The method of example 189 or any one of examples 190-194, wherein the first type of dielectric material comprises silicon oxide.
Example 196. The method of example 189 or any one of examples 190-195, wherein obtaining the stack of layers comprises:
  removing material from a first wafer formed of the first type of dielectric material to fabricate the first end layer, the second end layer (when combined with Example 194), or both; and
  removing material from a second wafer formed of dielectric material to fabricate the intermediate layers.
Example 197. The method of example 189 or any one of examples 190-195, wherein the intermediate layers comprise:
  a first subset of layers formed of the first type of dielectric material; and
  a second subset of layers formed of a second, different type of dielectric material.
Example 198. The method of example 197, wherein obtaining the stack of layers comprises:
  alternately bonding layers of the first and second subset of layers to each other to form the intermediate layers; and
  bonding the first intermediate layer to the first end layer.
Example 199. The method of example 197 or example 198, wherein obtaining the stack of layers comprises:
  removing material from a first wafer formed of the first type of dielectric material to fabricate the first end layer, one or more of the first subset of layers, the second end layer (when combined with Example 194), or any combination thereof; and
  removing material from a second wafer formed of the second type of dielectric material to fabricate one or more of the second subset of layers.
Example 200. The method of example 197 or any one of examples 198-199, wherein the second type of dielectric material is silicon.
Example 201. The method of example 189 or any one of examples 190-200, wherein bonding the second end layer comprises:
  altering the surface of the last intermediate layer to comprise a first plurality of hydroxyl ligands;
  altering a surface of the second end layer to comprise a second plurality of hydroxyl ligands; and
  contacting the altered surfaces to form a seal around the opening of the internal cavity, the seal defined by metal-oxygen bonds formed by reacting the first plurality of hydroxyl ligands with the second plurality of hydroxyl ligands during contact of the two altered surfaces.
Example 202. The method of example 201, wherein bonding the second end layer comprises:
  activating one or both of the surfaces of the last intermediate layer and the second end layer by exposing their respective surfaces to a plasma.
Example 203. The method of example 189 or any one of examples 190-202, wherein at least one of the intermediate layers comprises a plurality of the holes between the internal cavity and an outer perimeter of the intermediate layer.
Example 204. The method of example 203, wherein the plurality of holes extends through the intermediate layer.
Example 205. The method of example 203 or example 204, wherein the vapor cell, when manufactured, is configured to detect a target radiation; and wherein each of the plurality of holes has a largest dimension no greater than a wavelength of the target radiation.

Example 206. The method of example 205, wherein the target radiation has a wavelength of at least 0.3 mm.

Example 207. The method of example 189 or any one of examples 190-206, wherein obtaining the stack of layers comprises:

forming an adhesion layer on one or both sides of an intermediate layer to define respective bonding surfaces of the intermediate layer.

Example 208. The method of example 207, wherein the adhesion layer comprises silicon oxide.

Example 209. The method of example 189 or any one of examples 190-208, wherein the stack of layers comprises:

a first set of tabs extending outward from the intermediate layers on a first exterior side of the stack of layers (or body of the vapor cell); and a second set of tabs extending outward from the intermediate layers on a second exterior side of the stack of layers (or body of the vapor cell).

Example 210. The method of example 209, wherein the vapor cell is a first vapor cell;

wherein the first set of tabs defines a first mechanical interface that is configured to interlock with a second vapor cell (e.g., a second instance of the first vapor cell); and wherein the second set of tabs defines a second mechanical interface that is configured to interlock with a third vapor cell (e.g., a third instance of the first vapor cell).

Example 211. The method of example 189 or any one of examples 190-210, wherein the body comprises an outer shape; and wherein each layer in the stack comprises an outer perimeter surface that defines a cross-section of an outer shape at a location of the layer.

Example 212. The method of example 211, wherein the cross-section of the outer shape is constant along the stack of layers.

Example 213. The method of example 211, wherein at least two adjacent intermediate layers have respective outer perimeter surfaces that differ, relative to each other, in one or both of shape and size.

Example 214. The method of example 211, wherein the cross-section is circular in shape and varies in size along the stack of layers to define an outer spherical shape for the body.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A vapor cell, comprising:
   a body defined by a stack of layers bonded to each other, the stack of layers comprising:
      a first end layer at a first end of the body, the first end layer being formed of a first type of dielectric material that is optically transparent,
      a second end layer at a second, opposite end of the body, the second end layer being formed of dielectric material,
      intermediate layers between the first and second end layers and formed of dielectric material, the intermediate layers defining an internal cavity that extends through the body between the first end layer and the second end layer,
      a first set of tabs extending outward from the intermediate layers on a first exterior side of the body, and
      a second set of tabs extending outward from the intermediate layers on a second exterior side of the body; and
   a vapor or a source of the vapor disposed in the internal cavity.

2. The vapor cell of claim 1, wherein the second end layer is formed of the first type of dielectric material.

3. The vapor cell of claim 1, wherein the intermediate layers comprise:
   a first subset of layers formed of the first type of dielectric material; and
   a second subset of layers formed of a second, different type of dielectric material.

4. The vapor cell of claim 3, wherein the layers are ordered in the stack to alternate between the first type of dielectric material and the second type of dielectric material.

5. The vapor cell of claim 1,
   wherein the intermediate layers comprise a first subset of layers and a second subset of layers that alternate in sequence along the stack of layers;
   wherein each tab of the first set extends outward from a respective layer in the first subset of layers; and
   wherein each tab of the second set extends outward from a respective layer in the second subset of layers.

6. The vapor cell of claim 1, wherein the first and second sets of tabs are aligned with respective centers of the first and second exterior sides.

7. The vapor cell of claim 1,
   wherein the vapor cell is a first vapor cell;
   wherein the first set of tabs defines a first mechanical interface that is configured to interlock with a second vapor cell; and
   wherein the second set of tabs defines a second mechanical interface that is configured to interlock with a third vapor cell.

8. The vapor cell of claim 1, wherein at least one of the intermediate layers comprises a plurality of holes between the internal cavity and an outer perimeter of the intermediate layer.

9. The vapor cell of claim 8, wherein the plurality of holes extend through the intermediate layer.

10. The vapor cell of claim 8,
wherein the vapor cell is configured to detect a target radiation; and
wherein each of the plurality of holes has a largest dimension no greater than a wavelength of the target radiation.

11. The vapor cell of claim 1,
wherein the first end layer comprises:
an interior surface covering a first opening of the internal cavity adjacent the first end layer, and
an exterior surface opposite the interior surface; and
wherein one or both of the interior and exterior surfaces have an optical coating disposed thereon.

12. The vapor cell of claim 1, wherein the body has four exterior sides defining a square cross-section of the body, the four exterior sides comprising the first and second exterior sides.

13. The vapor cell of claim 12, wherein the first and second exterior sides are adjacent to each other.

14. The vapor cell of claim 12, wherein the first and second exterior sides are opposite each other.

15. The vapor cell of claim 12,
wherein the four exterior sides comprise third and fourth exterior sides; and
wherein the stack of layers comprises:
a third set of tabs extending outward from the intermediate layers on the third exterior side of the body, and
a fourth set of tabs extending outward from the intermediate layers on the fourth exterior side of the body.

16. The vapor cell of claim 15, wherein the first, second, third, and fourth sets of tabs are aligned with respective centers of the first, second, third, and fourth exterior sides.

17. A vapor cell system comprising:
an array of interlocked vapor cells, each interlocked vapor cell comprising:
a stack of layers bonded to each other and defining a body of the interlocked vapor cell, the stack of layers comprising:
a first end layer at a first end of the body, the first end layer being formed of a first type of dielectric material that is optically transparent,
a second end layer at a second, opposite end of the body, the second end layer being formed of dielectric material, and
one or more intermediate layers between the first and second end layers and formed of dielectric material, the one or more intermediate layers defining an internal cavity that extends through the stack of layers between the first end layer and the second end layer,
a first mechanical interface on a first exterior side of the body,
a second mechanical interface on a second exterior side of the body, and
a vapor or a source of the vapor disposed in the internal cavity;
wherein the first mechanical interface of at least one interlocked vapor cell is interlocked with the second mechanical interface of another interlocked vapor cell; and
wherein the second mechanical interface of the at least one interlocked vapor cell is interlocked with the first mechanical interface of another, different interlocked vapor cell.

18. The vapor cell system of claim 17,
wherein the first mechanical interface comprises a first set of tabs extending outward from the one or more intermediate layers on the first exterior side of the body; and
wherein the second mechanical interface comprises a second set of tabs extending outward from the one or more intermediate layers on the second exterior side of the body.

19. The vapor cell system of claim 17, wherein the one or more intermediate layers comprise at least one layer having a plurality of holes between the internal cavity and an outer perimeter of the intermediate layer.

* * * * *